(12) United States Patent
Ramkumar et al.

(10) Patent No.: US 10,062,573 B1
(45) Date of Patent: Aug. 28, 2018

(54) EMBEDDED SONOS WITH TRIPLE GATE OXIDE AND MANUFACTURING METHOD OF THE SAME

(71) Applicant: Cypress Semiconductor Corporation, San Jose, CA (US)

(72) Inventors: Krishnaswamy Ramkumar, San Jose, CA (US); Igor Kouznetsov, San Francisco, CA (US); Venkatraman Prabhakar, Pleasanton, CA (US); Ali Keshavarzi, Los Altos, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/683,274

(22) Filed: Aug. 22, 2017

Related U.S. Application Data

(60) Provisional application No. 62/519,757, filed on Jun. 14, 2017.

(51) Int. Cl.
| | |
|---|---|
| *H01L 21/28* | (2006.01) |
| *H01L 29/66* | (2006.01) |
| *H01L 29/792* | (2006.01) |
| *H01L 27/11568* | (2017.01) |
| *H01L 27/11573* | (2017.01) |
| *H01L 21/02* | (2006.01) |

(52) U.S. Cl.
CPC .... *H01L 21/28282* (2013.01); *H01L 21/0223* (2013.01); *H01L 21/02301* (2013.01); *H01L 27/11568* (2013.01); *H01L 27/11573* (2013.01); *H01L 29/66833* (2013.01); *H01L 29/792* (2013.01)

(58) Field of Classification Search
CPC ....... H01L 21/28282; H01L 21/823462; H01L 27/11573; H01L 21/02255; H01L 21/02301; H01L 27/11563; H01L 27/11568; H01L 29/4234; H01L 29/66833; H01L 29/792; H01L 21/76202; H01L 29/167; H01L 29/513
USPC .......................................................... 438/591
See application file for complete search history.

(56) References Cited

U.S. PATENT DOCUMENTS

| | | |
|---|---|---|
| 6,147,008 A | 11/2000 | Chwa et al. |
| 6,268,251 B1 | 7/2001 | Zhong et al. |
| 6,687,648 B1 | 2/2004 | Kumar et al. |
| 6,946,349 B1 | 9/2005 | Lee et al. |
| 7,015,101 B2 | 3/2006 | Zheng et al. |
| 7,410,874 B2 | 8/2008 | Verma et al. |
| 7,888,196 B2 | 2/2011 | Sridhar et al. |
| 8,409,950 B1 | 4/2013 | Shea et al. |
| 8,796,098 B1 * | 8/2014 | Ramkumar ....... H01L 29/66833 257/324 |

(Continued)

*Primary Examiner* — Duy T Nguyen

(57) ABSTRACT

A method to integrate silicon-oxide-nitride-oxide-silicon (SONOS) transistors into a complementary metal-oxide-semiconductor (CMOS) flow including a triple gate oxide structure. The memory device may include a non-volatile memory (NVM) transistor that has a charge-trapping layer and a blocking dielectric, a first field-effect transistor (FET) including a first gate oxide of a first thickness, a second FET including a second gate oxide of a second thickness, a third FET including a third gate oxide of a third thickness, in which the first thickness is greater than the second thickness and the second thickness is greater than the third thickness.

10 Claims, 21 Drawing Sheets

(56) References Cited

U.S. PATENT DOCUMENTS

| | | | |
|---|---|---|---|
| 9,218,978 B1* | 12/2015 | Ramkumar | H01L 29/792 |
| 2012/0056257 A1* | 3/2012 | Choi | H01L 29/94 257/300 |
| 2016/0204120 A1 | 7/2016 | Prabhakar et al. | |

* cited by examiner

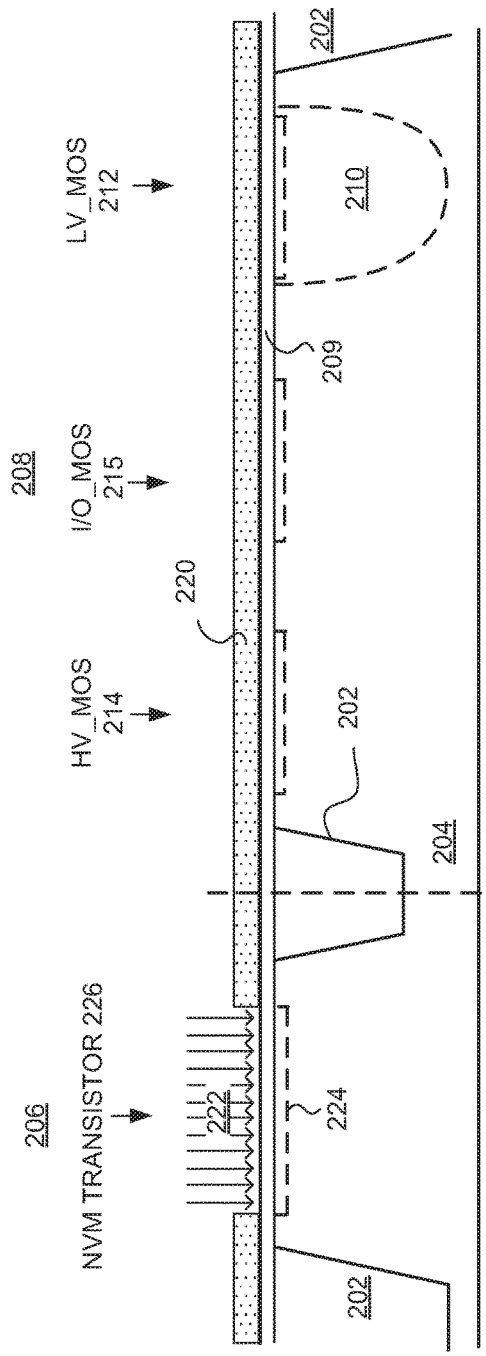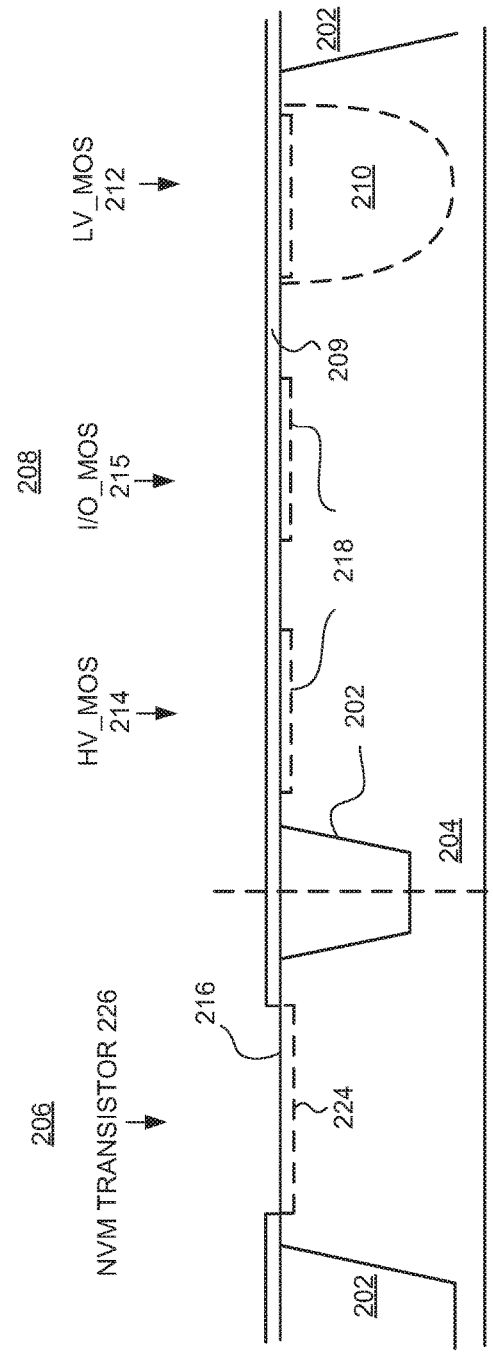

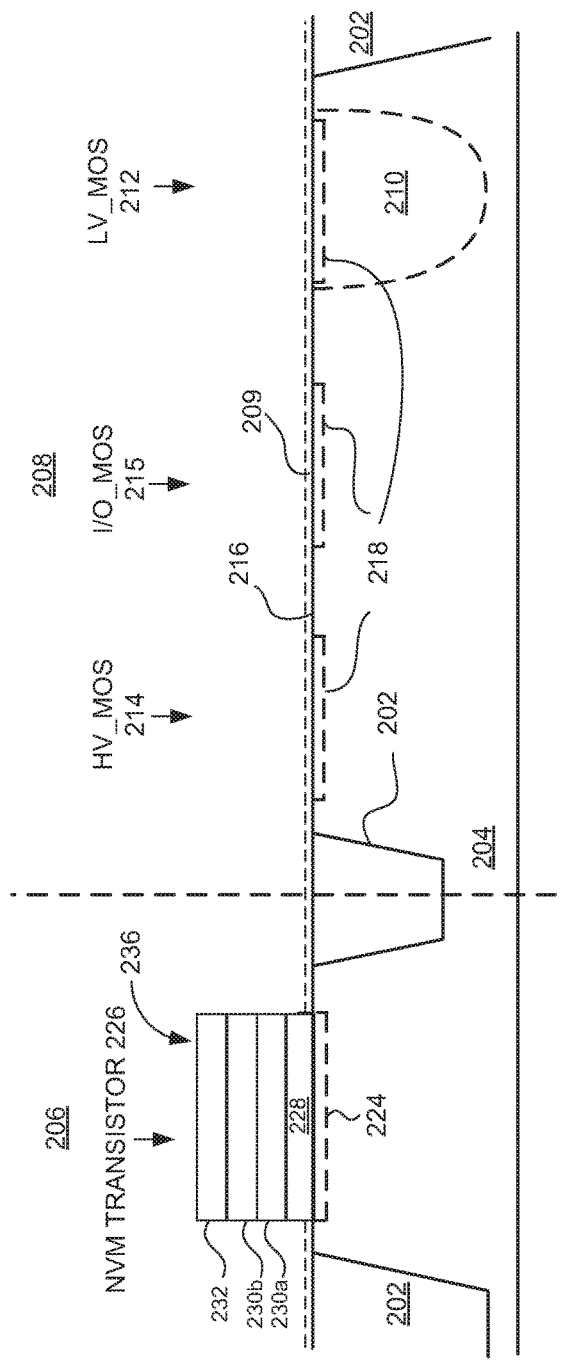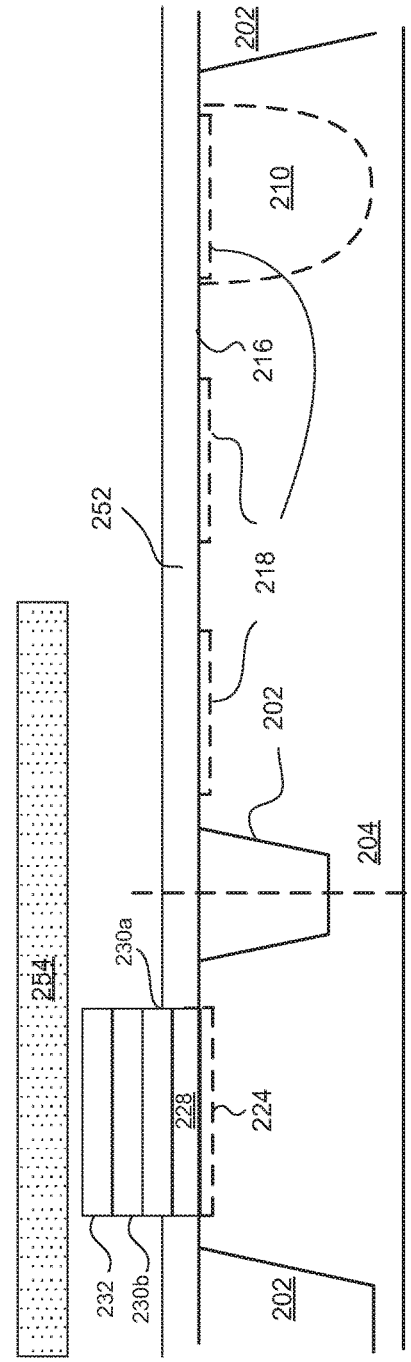
FIG. 2G
FIG. 2H

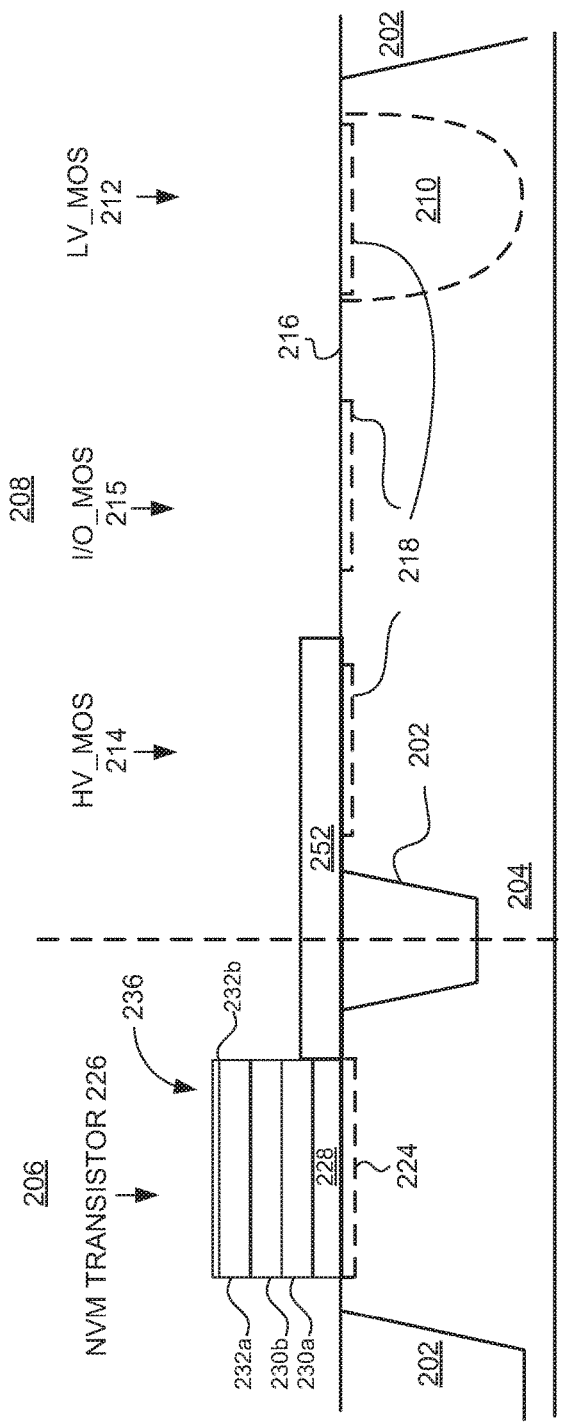
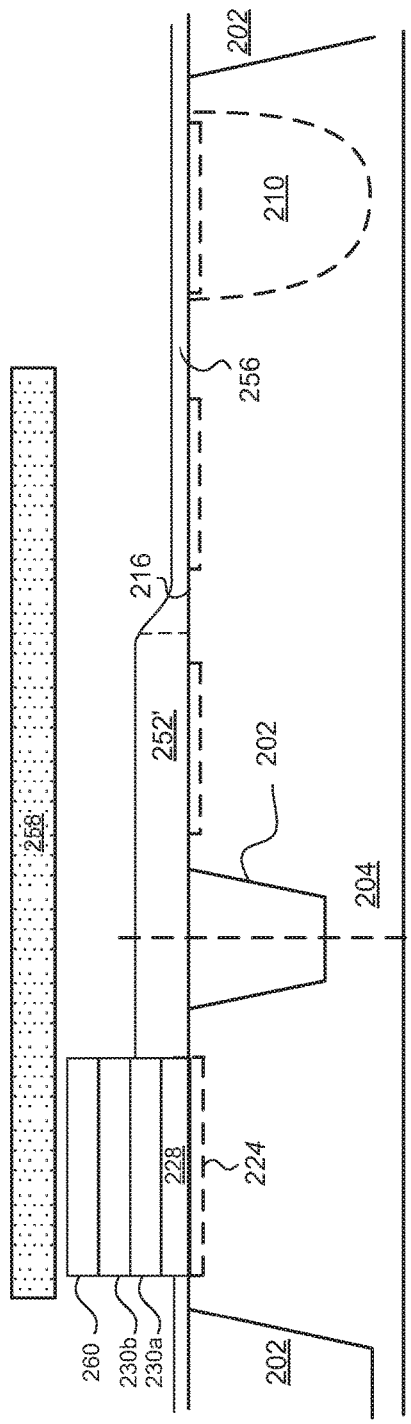
FIG. 2I
FIG. 2J

EMBEDDED SONOS WITH TRIPLE GATE OXIDE AND MANUFACTURING METHOD OF THE SAME

PRIORITY

The present application claims the priority and benefit under 35 U.S.C. § 119(e) of U.S. Provisional Application No. 62/519,757, filed on Jun. 14, 2017, which is incorporated by reference herein in its entirety.

TECHNICAL FIELD

The present disclosure relates generally to semiconductor devices, and more particularly to memory cells and methods of manufacturing thereof including an embedded or integrally formed charge-trapping gate stack into an existing complementary metal-oxide-semiconductor (CMOS) foundry logic technology.

BACKGROUND

For many applications, such as system-on-chip, it may be desirable to integrate logic devices and interface circuits based upon metal-oxide-semiconductor field-effect transistors (MOSFET) and non-volatile memory (NVM) transistors on a single chip or substrate. This integration, in some embodiments, may seriously impact both the MOS transistor and NVM transistor fabrication processes. MOS transistors are typically fabricated using a standard or baseline complementary-metal-oxide-semiconductor (CMOS) process flow, involving the formation and patterning of conducting, semiconducting and dielectric materials. The composition of these materials, as well as the composition and concentration of processing reagents, and temperature used in such a CMOS process flow are stringently controlled for each operation to ensure the resultant MOS transistors will function properly.

Non-volatile memory devices include non-volatile memory transistors, such as silicon-oxide-nitride-oxide-silicon or semiconductor-oxide-nitride-oxide-semiconductor (SONOS) based transistors, including charge-trapping gate stacks in which a stored or trapped charge changes a threshold voltage of the NVM transistor to store information as a logic "1" or "0". Charge-trapping gate stack formation may involve the formation of a nitride or oxynitride charge-trapping layer(s) disposed between two dielectric or oxide layers. Charge-trapping gate stack is typically fabricated using materials and processes that differ significantly from those of the baseline CMOS process flow, and which may detrimentally impact or be impacted by the fabrication of the MOS transistors. In particular, forming a gate oxide or dielectric of a MOS transistor may significantly degrade performance of a previously formed charge-trapping gate stack by altering a thickness or composition of the charge-trapping layer(s). In addition, this integration may also impact the baseline CMOS process flow, and generally require a substantial number of mask sets and process steps, which add to the expense of fabricating the devices and may reduce yield of working devices.

Besides, it may be important for the integrated fabrication process to be able to control the thickness of top or blocking dielectric of NVM transistors, for example, in order to meet requirements such as desirable threshold voltages Vts and/or equivalent oxide thickness (EOT) while satisfying gate oxide thickness targets of MOS transistors, especially if those MOS transistors are high voltage (HV) or input/output (I/O) transistors.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
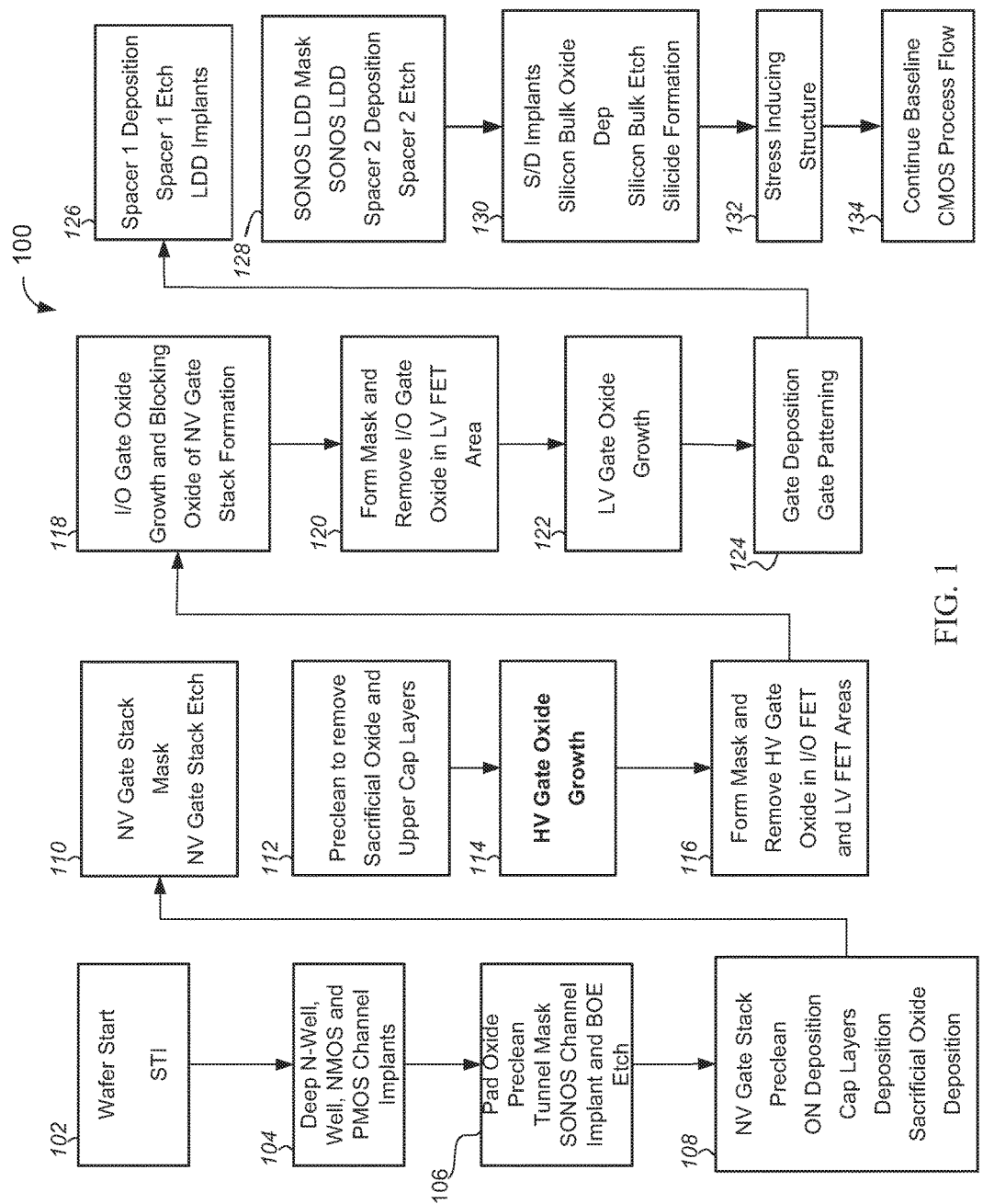
FIG. 1 is a flowchart illustrating an embodiment of a method for fabricating a memory cell or array including an embedded SONOS based NVM transistor and MOS transistors.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Embodiments of a memory cell including an embedded non-volatile memory (NVM) transistor and metal-oxide-semiconductor (MOS) transistors and methods of fabricating the same are described herein with reference to figures. However, particular embodiments may be practiced without one or more of these specific details, or in combination with other known methods, materials, and apparatuses in related art. In the following description, numerous specific details are set forth, such as specific materials, dimensions, concentrations, and processes parameters etc. to provide a thorough understanding of the subject matter. In other instances, well-known semiconductor design and fabrication techniques have not been described in particular detail to avoid unnecessarily obscuring the subject matter. Reference in the description to "an embodiment", "one embodiment", "an example embodiment", "some embodiments", and "various embodiments" means that a particular feature, structure, or characteristic described in connection with the embodiment(s) is included in at least one embodiment of the subject matter. Further, the appearances of the phrases "an embodiment", "one embodiment", "an example embodiment", "some embodiments", and "various embodiments" in various places in the description do not necessarily all refer to the same embodiment(s).

The description includes references to the accompanying drawings, which form a part of the detailed description. The drawings show illustrations in accordance with exemplary embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The terms "over", "under", "between", and "on" as used herein refer to a relative position of one layer with respect to other layers. As such, for example, one layer deposited or disposed over or under another layer may be directly in contact with the other layer or may have one or more intervening layers. Moreover, one layer deposited or disposed between layers may be directly in contact with the layers or may have one or more intervening layers. In contrast, a first layer "on" a second layer is in contact with that second layer. Additionally, the relative position of one layer with respect to other layers is provided assuming operations deposit, modify and remove films relative to a starting substrate without consideration of the absolute orientation of the substrate.

Figure 2A:
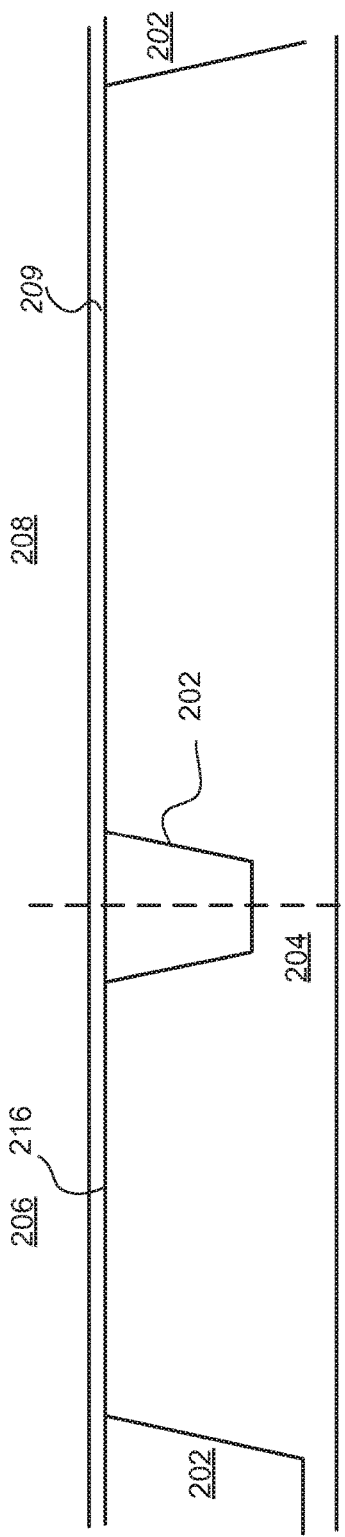
FIGS. 2A-2N are representative diagrams illustrating cross-sectional views of a portion of a memory cell during fabrication of the memory cell according to the method of FIG. 1.

The NVM transistor may include memory transistors or devices implemented related to Silicon-Oxide-Nitride-Oxide-Silicon (SONOS) or floating gate technology. An embodiment of a method for integrating or embedding a NVM transistor into a standard or baseline CMOS process flow for fabricating one or more MOS transistors, which include triple gates, will now be described in detail with reference to FIG. 1 and FIGS. 2A through 2N. FIG. 1 is a flowchart illustrating an embodiment of a method or process flow for fabricating the memory cell or array. FIGS. 2A-2N are block diagrams illustrating cross-sectional views of a portion of a memory cell during fabrication of the memory cell according to the method of FIG. 1. FIG. 2O is a representative diagram illustrating a cross-sectional view of a portion of an embodiment of the finished memory cell or array.

SUMMARY OF SUBJECT MATTER

According to one embodiment, a memory device disclosed herein may have a non-volatile memory (NVM) transistor including a charge-trapping layer and a blocking dielectric, a first field-effect transistor (FET) including a first gate oxide of a first thickness, a second FET including a second gate oxide of a second thickness, and a third FET including a third gate oxide of a third thickness. In one embodiment, the first, second, and third FETs may each have a mutually different thickness of its corresponding gate oxide.

In one embodiment, the first thickness may be greater than the second thickness and the second thickness may be greater than the third thickness. In some embodiments, the NVM transistor and the first, second, and third FETs may be disposed in a single semiconductor die. In one embodiment, the NVM transistor may be a SONOS transistor.

In one embodiment, thicknesses of the first, second, and third gate oxides may be in the approximate ranges of 120 Å-150 Å, 50 Å-55 Å, 15 Å-20 Å, respectively. The first, second, and third FETs may be configured to be a high voltage (HV) transistor operated in a range of 4.5 V-12 V, an input/output (I/O) transistor operated in a range of 1.6 V-3.6 V, and a low voltage (LV) or core transistor operated in a range of 0.8 V-1.4 V, respectively. In some embodiments, one or more of the blocking dielectric of the NVM transistor, the first, second, and third gate oxides may include a nitrogen-rich silicon oxide film.

In one embodiment, the memory device may further have a stress inducing structure, which includes either a compressive nitride layer or a tensile nitride layer.

According to another embodiment, an operation method may include a step of obtaining a memory device disposed within a single semiconductor die, the memory device including a non-volatile memory (NVM) transistor, first, second, and third field-effect transistors (FETs). In one embodiment, the first, second, and third FETs may each include a gate oxide having a mutually different thickness from one another.

In one embodiment, the operation method may also include a step of providing a first operating voltage in an approximate range of 4.5 V-12 V to the first FET, in which the first operating voltage may be configured to program or erase the NVM transistor.

In one embodiment, the operation method may also include a step of providing a second operating voltage in an approximate range of 1.6 V-3.6 V to the second FET, in which the second operating voltage may include an input/output voltage of the memory device.

In one embodiment, the operation method may also include a step of providing a third operating voltage in an approximate range of 0.8 V-1.4 V to the third FET.

In some embodiments of application, such as smartcard applications, NVM transistors are embedded into MOS transistors including I/O or HV MOS transistors or field-effect transistors (FETs) in which a thick gate oxide is required. For instance, in one embodiment, one of the MOS transistors may be a HV transistor and thus requires a thick gate oxide having an approximate thickness of up to 100 Å to 200 Å. In some process flows, HV MOS gate oxide and NVM blocking oxide are formed concurrently. While the HV MOS gate oxide may be formed/grown to its required thickness, since blocking or top oxide of the NVM transistor is subjected to the same environment during oxidation of the gate oxide of HV MOS transistor(s), it may be grown to be too thick. As a result, the NVM transistor may not meet the requirements for EOT and program/erase Vts.

In this disclosure, a process to embed an Oxide-Nitride-Oxide (ONO) or ONONO charge trapping stack with single-layer or bi-layer nitride into a CMOS process that uses a thick gate oxide for its HV and I/O devices is introduced and described. In some embodiments, the aforementioned ONO stack formation sequence may not be appropriate for CMOS process flows that include fabrication of thick gate oxide layers for some of the HV or I/O MOS transistors. In such a process flow, in-situ steam generation (ISSG) or radical oxidation process may not be ideal for the gate oxidation for both top oxide layer of the NVM transistors and gate oxide layer for the HV or I/O MOS transistors. In order to achieve the targeted thickness of gate oxide of HV or I/O MOS transistors, top oxide grown on the ONO stack may be exposed to the ISSG process for too long and end up being too thick. Alternatively, gate oxides of the HV or I/O MOS transistors may be grown by either a furnace process or a rapid thermal oxidation (RTO) process. In those embodiments, the furnace process or RTO process may effect moisture from isolation structures, such as shallow trench isolation (STI) dielectric, to diffuse to the ONO film, and change the thickness or uniformity of thickness of the critical tunnel oxide layer of the NVM transistors. As a result, threshold voltage of the NVM transistors may be degraded. Moreover, furnace and RTO processes are generally operated at very high temperature (up to approximately 1100° C.). The high temperature may cause changes in trap density of the nitride layer of the ONO stack, which may also degrade the threshold voltage of the NVM transistors.

To address the above issues as well as other issues, embodiments disclosed herein include processes that may enhance the retention performance of NVM transistors, such as SONOS. A Triple Gate Oxide approach is introduced that allows the use of a high voltage for programming/erasing of SONOS, which in turn makes the sensing threshold voltage (Vt) window much larger at the End-of-Life (EOL) of SONOS memory cells. At the same time, the embodiments disclosed are able to support the widely used I/O voltage of 2.5 V to 3.3 V, with the I/O MOS transistors.

Further, embodiments depicted herein may be directed to fabrication processes that ensure that the ONO stack of the NVM transistors meets the thickness and reliability requirements without degradation of the ONO stack performance, due to the thick gate layer oxidation of the HV and/or I/O MOS transistors in an embedded system.

Referring to FIG. 1 and FIG. 2A, the process begins with forming a number of isolation structures or shallow trench isolation (STI) 202 in a wafer or substrate 204 (step 102). The isolation structures 202 isolate the memory cell being formed from memory cells formed in adjoining areas (not shown) of the substrate 204. Optionally and additionally, isolation structures 202 may be incorporated to isolate the NVM transistor(s) being formed in a first region 206 of the substrate 204 from one or more of the MOS transistors including HV MOS, I/O MOS, and LV MOS, being formed in a second region 208. In one embodiment, the isolation structures 202 may include a dielectric material, such as oxide or nitride, and may be formed by any conventional technique, including but not limited to STI or local oxidation of silicon (LOCOS). The substrate 204 may be a bulk substrate composed of any single crystal material suitable for semiconductor device fabrication, or may include a top epitaxial layer of a suitable material formed on a substrate. In one embodiment, suitable materials for the substrate 204 include, but are not limited to, silicon, germanium, silicon-germanium or a Group III-V compound semiconductor material.

Optionally and in some embodiments, as best shown in FIG. 2A, pad oxide 209 may be formed over a surface 216 of the substrate 204 in both the first region 206 and the second region 208. In one embodiment, pad oxide 209 may be silicon dioxide ($SiO_2$) having a thickness of from about 10 nanometers (nm) to about 20 nm and may be grown by a thermal oxidation process or in-situ steam generation (ISSG) process, or other oxidation or deposition processes known in the art. It will be the understanding that pad oxide 209 may not be necessary, or formed in some embodiments.

Figure 2B:
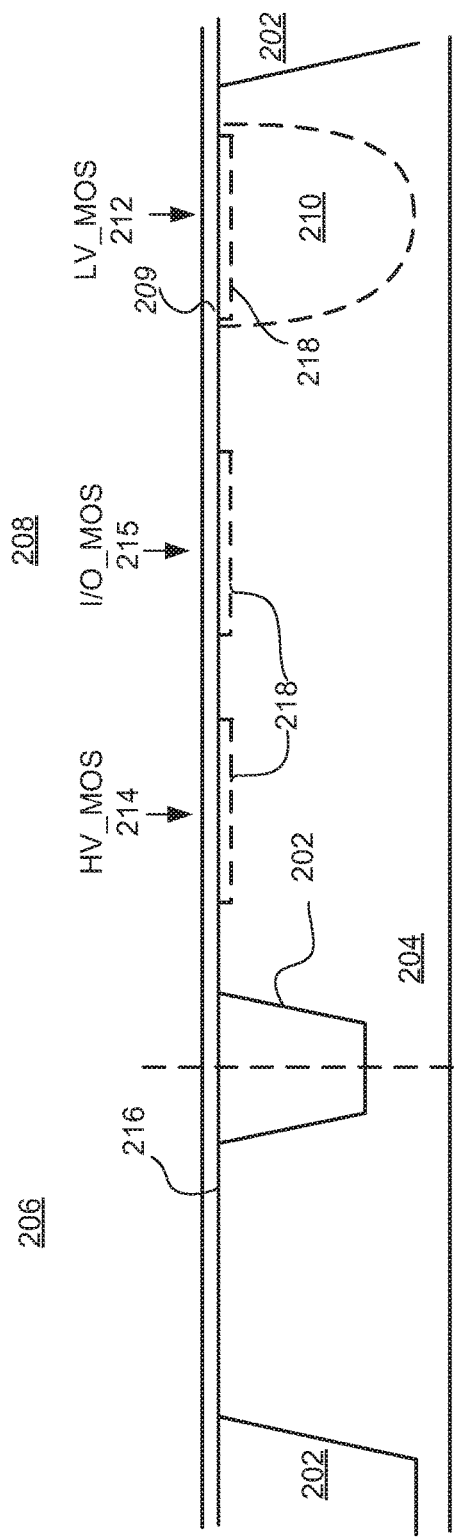
FIG. 2O is a representative diagram illustrating a cross-sectional view of a portion of a finished memory cell including an embedded SONOS based NVM transistor and MOS transistors fabricated according to the method of FIGS. 1 and 2A-2N.

Referring to FIG. 1 and FIG. 2B, dopants are then implanted into substrate 204 through pad oxide 209 (if present) to form wells in which the NVM transistor(s) and/or the MOS transistors may be formed, and channels for the MOS transistors (step 104). According to system design, there may or may not be isolation structures 202 disposed between the first region 206 and the second region 208. The dopants implanted may be of any type and concentration, and may be implanted at any energy, including energies necessary to form wells or deep wells for the NVM transistors and/or the MOS transistors, and to form channels for the MOS transistors. In one particular embodiment, illustrated in FIG. 2B as an example, dopants of an appropriate ion species are implanted to form a deep N-well 210 in the second region 208 over or in which LV MOS transistor 212 may be formed. In alternative embodiments, wells or deep wells may also be formed for the NVM transistor 226 and/or HV MOS transistor 214, and/or I/O MOS transistor 215. It is further appreciated that the wells, such as deep N-well 210, may be formed by depositing and patterning a mask layer, such as a photoresist layer above surface 216 of substrate 204, and implanting an appropriate ion species at an appropriate energy to an appropriate concentration.

In one embodiment, channels 218 for one or more of the HV, I/O, and LV MOS transistors 214, 215, 212 may be formed in the second region 208 of substrate 204. It will be the understanding that channels 218 of HV, I/O, and LV MOS transistors 214, 215, 212 may or may not be formed concurrently. As with the well implant, channels 218 may be formed by depositing and patterning a mask layer, such as a photoresist layer above the surface 216 of substrate 204, and implanting an appropriate ion species at an appropriate energy to an appropriate concentration. In one embodiment, for example, $BF_2$ may be implanted at an energy of from about 10 kilo-electron volts (keV), to about 100 keV, and a dose of from about 1e12 $cm^{-2}$ to about 1e14 $cm^{-2}$ to form an N-type MOS (NMOS) transistor. A P-type MOS (PMOS) transistor may likewise be formed by implantation of arsenic (As) or phosphorous (P) ions at any suitable dose and energy. It is appreciated that implantation may also be used to form channels 218, in all three of the MOS transistors 214, 212, 215 at the same time, or at separate times using standard lithographic techniques, including a patterned photoresist layer to mask one of the channels 218 for the MOS transistors 214, 212, 215.

Next, referring to FIG. 1 and FIGS. 2C and 2D, a patterned tunnel mask 220 is formed on or overlying pad oxide 209 layer, ions (represented by arrows 222) of an appropriate type, energy, and concentration are implanted through a window or opening in tunnel mask 220 to form channel 224 for NVM transistor 226 in the first region 206, and tunnel mask 220 and pad oxide 209 layer in at least the second region 208 removed (step 106). Tunnel mask 220 may include a photoresist layer, or a hard mask formed, from a patterned nitride or silicon-nitride layer.

In one embodiment, channel 224 for NVM transistor 226 may be a deep indium doped channel implanted with indium (In) at an energy of from about 50 kilo-electron volts (keV) to about 500 keV, and a dose of from about 5e11 $cm^{-2}$ to about 1e13 $cm^{-2}$ to form an n-channel NVM transistor 226. In one embodiment, implanting indium to form channel 224 of NVM transistor 226 improves the threshold voltage (VT) uniformity of the finished NVM transistor from a sigma of VT from about 150 millivolts (mV) to about 70-80 mV. Optionally or additionally, a shallow doped channel is implanted with arsenic at an energy about 20 keV and a dose of from about 5e11 $cm^{-2}$ to about 1e13 $cm^{-2}$ at channel 224. Alternatively, $BF_2$ may be implanted to form an n-channel NVM transistor, or arsenic or phosphorous implanted to form a p-channel NVM transistor. In one alternative embodiment, channel 224 for NVM transistor 226 may also be formed concurrently with channels 218 of the MOS transistors 214, 212, 215.

In one embodiment, as illustrated in FIG. 2D, pad oxide 209 in the window or opening in the tunnel mask 220 may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. Subsequently or concurrently, tunnel mask 220 includes photoresist material may be ashed or stripped using oxygen plasma. Alternatively, hard tunnel mask 220 may be removed using a wet or dry etch process known in the art.

Figure 2E:
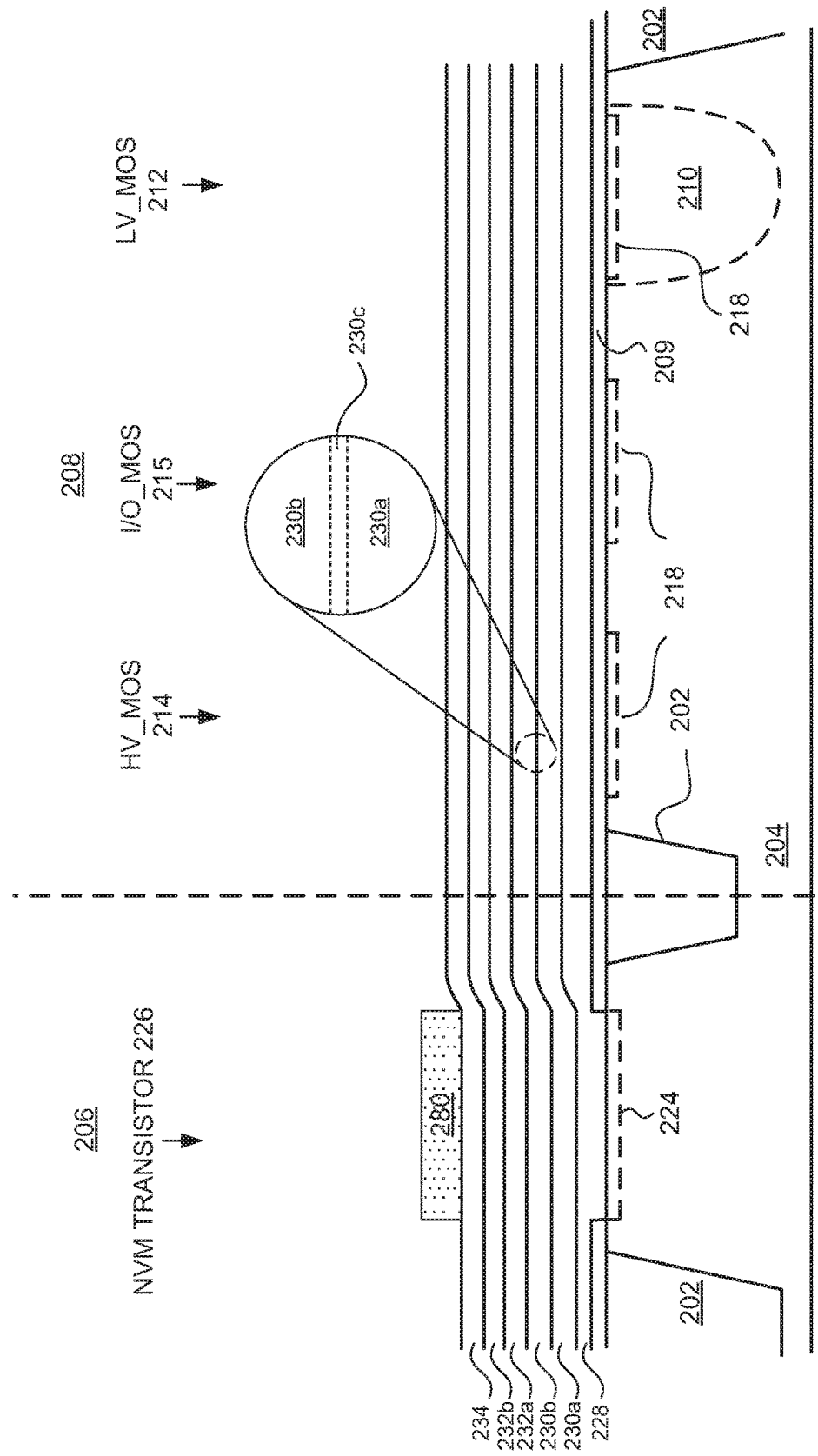
Figure 2F:
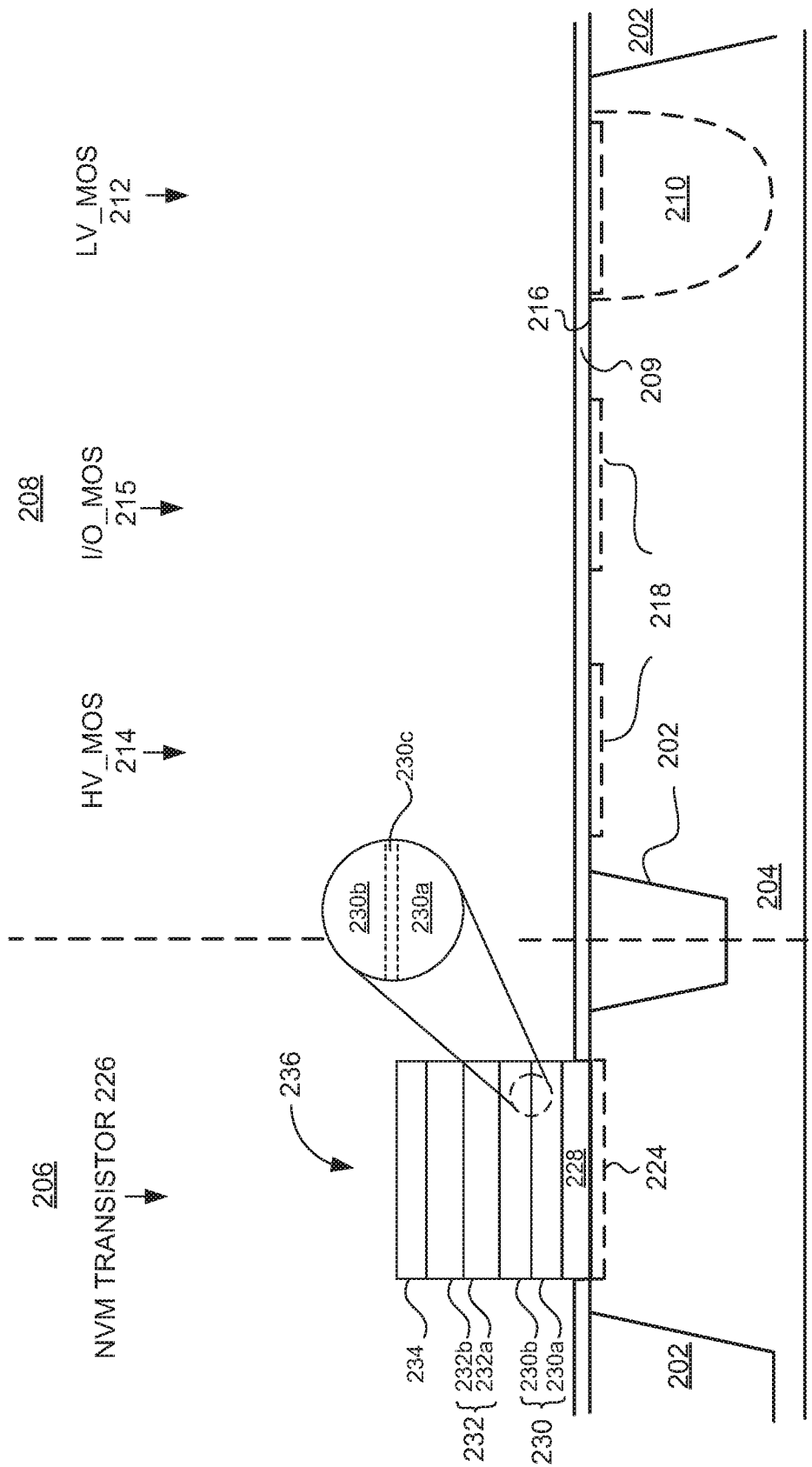

Referring to FIG. 1 and FIGS. 2E to 2F, surface 216 of substrate 204 in the first region 206 is cleaned or pre-cleaned, a number of dielectric layers, such as oxide-nitride-oxide or ONO layers or oxide-nitride-oxide-nitride-oxide or ONONO layers, formed or deposited (step 108). Subsequently, a mask is formed on or overlying the dielectric layers, and the dielectric layers are etched to form NV gate stack 236 in first region 206 (step 110). The preclean may be a wet or dry process. In one embodiment, it may be a wet process using HF or standard cleans (SC1) and (SC2), and is highly selective to the material of substrate 204. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

Referring to FIG. 2E, the dielectric or NV gate stack 236 deposition begins with the formation of tunnel dielectric 228 over at least channel 224 of NVM transistor 226 in the first region 206 of substrate 204, and may spread over to second region 208 of substrate 204 where MOS transistors 212, 214, 215 are formed. The tunnel dielectric 228 may be any material and have any thickness suitable to allow charge carriers to tunnel into an overlying charge-trapping layer under an applied gate bias while maintaining a suitable barrier to leakage when NVM transistor 226 is unbiased. In certain embodiments, tunnel dielectric 228 may be silicon dioxide, silicon oxy-nitride, or a combination thereof and may be grown by a thermal oxidation process, using ISSG or radical oxidation.

In one embodiment a silicon dioxide tunnel dielectric 228 may be thermally grown in a thermal oxidation process. For example, a layer of silicon dioxide may be grown utilizing dry oxidation at 750° C.-800° C. in an oxygen containing gas or atmosphere, such as oxygen ($O_2$) gas. The thermal oxidation process is carried out for a duration approximately in the range of 50 to 150 minutes to effect growth of a tunnel dielectric 228 having a relatively uniform thickness of from about 1.0 nanometers (nm) to about 3.0 nm by oxidation and consumption of the exposed surface of substrate. It will be understood that such a range is merely illustrative and is not meant to be limiting.

In another embodiment, a silicon dioxide tunnel dielectric 228 may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of about 900° C. to about 1100° C. at a pressure approximately in the range of about 0.5 Torr to about 10 Torr to form radicals, such as, an OH radical, an $HO_2$ radical or an O diradical, at the surface of substrate. The radical oxidation process is carried out for a duration approximately in the approximate range of about 1 to about 10 minutes to effect growth of a tunnel dielectric 228 having a thickness of from about 1.0 nanometers (nm) to about 4.0 nm by oxidation and consumption of the exposed surface of substrate. It will be understood that in FIG. 2E and subsequent figures the thickness of tunnel dielectric 228 may be exaggerated for the purposes of clarity. In one embodiment, tunnel dielectric 228 grown in a radical oxidation process may be both denser and composed of substantially fewer hydrogen atoms per $cm^3$ than a tunnel dielectric formed by wet oxidation techniques, even at a reduced thickness. In certain embodiments, the radical oxidation process is carried out in a batch-processing chamber or furnace capable of processing multiple substrates to provide a high quality tunnel dielectric 228 without impacting the throughput (substrates/hr.) requirements that a fabrication facility may require.

In another embodiment, tunnel dielectric layer 228 is deposited by chemical vapor deposition (CVD) or atomic layer deposition and is composed of a dielectric layer which may include, but is not limited to silicon dioxide, silicon oxy-nitride, silicon nitride, aluminum oxide, hafnium oxide, zirconium oxide, hafnium silicate, zirconium silicate, hafnium oxy-nitride, hafnium zirconium oxide and lanthanum oxide. In yet another embodiment, tunnel dielectric 228 may be a bi-layer dielectric region including a bottom layer of a material such as, but not limited to, silicon dioxide or silicon oxy-nitride and a top layer of a material which may include, but is not limited to silicon nitride, aluminum oxide, hafnium oxide, zirconium oxide, hafnium silicate, zirconium silicate, hafnium oxy-nitride, hafnium zirconium oxide and lanthanum oxide.

Referring again to FIG. 2E, a charge-trapping layer is formed on or overlying the tunnel dielectric 228. Generally, as best shown in FIG. 2F, the charge-trapping layer may be a multi-layer charge-trapping layer 230 comprising multiple layers including at least a lower or first charge-trapping layer 230a which is physically closer to the tunnel dielectric 228, and an upper or second charge-trapping layer 230b that is oxygen-lean relative to the first charge-trapping layer, and comprises a majority of a charge traps distributed in multi-layer charge-trapping layer 230.

The first charge-trapping layer 230a of multi-layer charge-trapping layer 230 may include a silicon nitride ($Si_3N_4$), silicon-rich silicon nitride or a silicon oxy-nitride ($SiO_xN_y$ (HO)) layer. For example, the first charge-trapping layer 230a may include a silicon oxynitride layer having a thickness of between about 2.0 nm and about 6.0 nm formed by a CVD process using dichlorosilane (DCS)/ammonia ($NH_3$) and nitrous oxide ($N_2O$)/$NH_3$ gas mixtures in ratios and at flow rates tailored to provide a silicon-rich and oxygen-rich oxynitride layer.

The second charge-trapping layer 230b of the Multi-Layer Charge-Trapping Layer 230 is then formed, either directly or indirectly, over the first charge-trapping layer 230a. In one embodiment, the second charge-trapping layer 230b may include a silicon nitride and silicon oxy-nitride layer having a stoichiometric ratio of oxygen, nitrogen and/or silicon that is different from that of the first charge-trapping layer 230 *a*. The second charge-trapping layer 230 *b* may include a silicon oxynitride layer having a thickness of between about 2.0 nm and about 8.0 nm, and may be formed or deposited by a CVD process using a process gas including DCS/NH$_3$ and N$_2$O/NH$_3$ gas mixtures in ratios and at flow rates tailored to provide a silicon-rich, oxygen-lean top nitride layer. In one alternative embodiment, the stoichiometric composition of oxygen, nitrogen and/or silicon of first and second charge-trapping layers 230 *a* and 230 *b* may be identical or approximately equal to one another.

In another embodiment, there may be a thin dielectric and/or oxide layer 230 *c* formed between the first and second charge-trapping layers 230 *a* and 230 *b*, making the multi-layer charge trapping layer 230 an NON stack. In some embodiments, the multi-layer charge-trapping layer 230 is a split charge-trapping layer, further including a thin, middle oxide layer 230 *c* separating the first (lower) and second (upper) charge-trapping layers 230 *a* and 230 *b*. The middle oxide layer 230 *c* substantially reduces the probability of electron charge that accumulates at the boundaries of the second charge-trapping layer 230*b* during programming from tunneling into the first charge-trapping layer 230*a*, resulting in lower leakage current than for the conventional memory devices. In one embodiment, the middle oxide layer 230 *c* may be formed by oxidizing to a chosen depth of the first charge-trapping layer 230 *a* using thermal or radical oxidation. Radical oxidation may be performed, for example, at a temperature of 1000-1100° C. using a single substrate tool, or 800-900° C. using a batch reactor tool. A mixture of H$_2$ and O$_2$ gasses may be introduced to a process chamber at a ratio of approximately 1:1 and 10-15 Torr. using a single substrate tool, or a pressure of 300-500 Torr. for a batch process, for a time of 1-2 minutes using a single substrate tool, or 30 min to 1 hour using a batch process. In some embodiments, the radical oxidation process is without an ignition event, such as forming of plasma, which would otherwise typically be used to pyrolyze the H$_2$ and O$_2$ to form steam. Instead, the H$_2$ and O$_2$ is permitted to react at a surface of the first charge-trapping layer 230 *a* to form radicals, such as, an OH radical, an HO$_2$ radical or an O diradical, to form the middle oxide layer 230 *c*.

As used herein, the terms "oxygen-rich" and "silicon-rich" are relative to a stoichiometric silicon nitride, or "nitride," commonly employed in the art having a composition of (Si$_3$N$_4$) and with a refractive index (RI) of approximately 2.0. Thus, "oxygen-rich" silicon oxynitride entails a shift from stoichiometric silicon nitride toward a higher weight % of silicon and oxygen (i.e. reduction of nitrogen). An oxygen rich silicon oxynitride film is therefore more like silicon dioxide and the RI is reduced toward the 1.45 RI of pure silicon dioxide. Similarly, films described herein as "silicon-rich" entail a shift from stoichiometric silicon nitride toward a higher weight % of silicon with less oxygen than an "oxygen-rich" film. A silicon-rich silicon oxynitride film is therefore more like silicon and the RI is increased toward the 3.5 RI of pure silicon.

Referring again to FIG. 2E, the number of dielectric layers further includes cap layer 232 formed on or overlying charge-trapping layer 230 or second charge-trapping layer 230 *b*. In some embodiments, such as that shown, cap layer 232 is a multi-layer cap layer including at least a lower or first cap layer 232 *a* overlying the charge-trapping layer 230, and a second cap layer 232 *b* overlying the first cap layer 232 *a*.

In one embodiment, first cap layer 232 *a* may include a high-temperature-oxide (HTO), such as silicon oxide (SiO$_2$), having a thickness of between 2.0 nm and 4.0 nm deposited using a low pressure chemical vapor deposition (LPCVD) thermal oxidation process. For example, the oxidation process may include exposing the substrate 206 to a silicon source, such as silane, chlorosilane, or dichlorosilane, and an oxygen-containing gas, such as O$_2$ or N$_2$O in a deposition chamber at a pressure of from about 50 mT to about 1000 mT, for a period of from about 10 minutes to about 120 minutes while maintaining the substrate at a temperature of from about 900° C. to about 1000° C. In some embodiments, the oxidation process is performed in-situ in the same process chamber as used to form second charge-trapping layer 230 *b*, and immediately following the formation of second charge-trapping layer 230 *b*.

In one embodiment, second cap layer 232 *b* may include a silicon nitride, a silicon-rich silicon nitride or a silicon-rich silicon oxynitride layer having a thickness of between 2.0 nm and 4.0 nm formed by a CVD process using N$_2$O/NH$_3$ and DCS/NH$_3$ gas mixtures.

In some embodiments, first and second cap layers 232 *a* and *b* may both include silicon nitride, a silicon-rich silicon nitride or a silicon-rich silicon oxynitride layer formed by CVD process using N$_2$O/NH$_3$ and DCS/NH$_3$ gas mixtures. First and second cap layers 232 *a* and *b* may or may not have the same stoichiometry.

Referring still to FIGS. 1 and 2E, a sacrificial oxide layer 234 is formed on or overlying cap layer 232. In one embodiment, sacrificial oxide layer 234 may include a high-temperature-oxide (HTO) layer grown by a thermal oxidation process or radical oxidation, and having a thickness of between 2.0 nm and 4.0 nm. In another embodiment, sacrificial oxide layer 234 may be formed or deposited by a chemical vapor deposition process in a low pressure chemical vapor deposition (LPCVD) chamber. For example, sacrificial oxide layer 234 may be deposited by a CVD process using a process gas including gas mixtures of silane or DCS and an oxygen containing gas, such as O$_2$ or N$_2$O, in ratios and at flow rates tailored to provide a silicon dioxide (SiO$_2$) sacrificial oxide layer 234.

Next, still referring to FIGS. 1 and 2E, a patterned mask layer is formed on or overlying the sacrificial oxide layer 234, and referring to FIG. 2F, the sacrificial oxide layer 234, cap layer 232 and charge-trapping layer 230, and tunnel dielectric layer 228 are etched or patterned to form NV gate stack 236. In one embodiment, NV gate stack 236 may be disposed substantially overlying channel 224 of NVM transistor 226 in first region 206. The etching or patterning process may further remove various dielectric layers of NV gate stack 236 from second region 208 of substrate 204 (step 110). The patterned mask layer 280 may include a photoresist layer patterned using standard lithographic techniques, and the NV gate stack 236 layers in second region 208 may be etched or removed using a dry etch process including one or more separate steps to stop on a surface of the tunnel dielectric 228 or pad oxide 209. In one embodiment, the etching may be configured to remove dielectric layers in NV gate stack in STIs 202 divot by introducing an isotropic component, and be stopped in second region 208 when a minimum of approximately 45 Å of pad oxide 209 remaining.

Referring to FIGS. 1, 2F, and 2G, sacrificial oxide layer 234 and a top portion or substantially all of second cap layer 232 *b* in the multi-layer cap layer 232 are removed from NV gate stack 236 in a highly selective cleaning process (step 112). This cleaning process further removes any oxide, such as oxide in tunnel dielectric 228 and/or pad oxide 209, remaining in the first region 206 beyond NV gate stack 236, and in second region 208 to prepare substrate 204 for HV gate oxide 252 layer growth. In one alternative embodiment, pad oxide 109 may not be removed entirely or at all (dotted line in FIG. 2G). In one exemplary implementation, sacrificial oxide layer 234 and second cap layer 232 b may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Next, referring to FIG. 1 and FIG. 2H, HV gate oxide 252 layer is formed over substrate 204 (step 114), either directly or indirectly. In one embodiment, as best illustrated in FIG. 2G, the process starts when pad oxide 209 is completely or partially removed in a pad oxide preclean process. After pad oxide 209 is removed, either partially or completely, HV gate oxide 252 layer is formed by a dry rapid thermal oxidation (RTO) process, a conventional or furnace oxidation process, a chemical vapor deposition process (CVD), or other non-radical oxide forming processes known in the art, or a combination thereof. In one embodiment, wet furnace oxidation may not be recommended, as explained in later sections.

In one embodiment, as an example, the oxidation process starts with dry RTO performed in a batch or single wafer processing chamber with or without an ignition event such as plasma. For example, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr. to form HV gate oxide 252 layer. In one embodiment, HV gate oxide 252 layer may be grown, by oxidizing silicon wafer 204, on at least a portion of the surface 216 of wafer 204. In one alternative embodiment, RTO process may be substituted with a rapid molecular oxidation which is a non-radical oxidation process. In one embodiment, HV gate oxide 252 layer however may not be formed by a wet rapid and radical oxidation process, such as in-situ steam generation (ISSG) because such radical oxidation processes may affect or oxidize cap layers 232 a and/or 232 b and second charge-trapping layer 230 b of NV gate stack 226 in the first region 206. In alternative embodiments, RTO or conventional furnace oxidation processes may be substituted by processes such as chemical vapor deposition (CVD), or other non-radical oxidation processes performed in a batch or single wafer processing chamber with or without an ignition event such as plasma as long as oxide will be grown or deposited to form HV gate oxide 252 layer in the second region 208. In one embodiment, by controlling operation parameters in the HV gate oxide 252 layer formation, targeted thickness of HV gate oxide 252 layer may be achieved. The parameters may include time duration, temperature, pressure, reactants etc. of the RTO, furnace oxidation, and CVD processes. As will be explained in later sections, at least a portion of HV gate oxide 252 layer remains in the finished device as HV gate oxide 252 of HV MOS transistor 214. In one embodiment, to withstand the relatively high operating voltages, desirable thickness of HV gate oxide 252 layer may be targeted to be approximately between 100 Å to 200 Å, or other thicknesses. It will be understood that such a range is merely illustrative and is not meant to be limiting. In one embodiment, HV gate oxide 252 layer may be formed, in the processes described in FIG. 2H, to be thicker than the desirable thickness. Excessive HV gate oxide 252 layer may be removed in later processes, to achieve the desirable or final thickness of HV gate oxide 252 of HV MOS transistor 214.

Referring to FIG. 2H again, after HV gate oxide 252 layer is formed, a patterned mask layer 254 may be formed on or overlying at least NV gate stack 236 in the first region 206 and HV gate oxide 252 layer over channel 218 of HV MOS 214 in the second region 208 (step 116). The patterned mask layer 254 may include a photoresist layer patterned using standard lithographic techniques, a hard mask layer, or other techniques known in the art.

Next, referring to FIGS. 1 and 2I, HV gate oxide 252 layer overlying at least channels 218 of I/O MOS 215 and LV MOS 212 in the second region 208 of substrate 204 is removed (step 116). After the oxide etch step, substrate surface 216 in I/O MOS 215 and LV MOS 212 areas may be exposed. In one exemplary embodiment, HV gate oxide 252 layer may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, or any other similar hydrofluoric-based wet etching chemistry. In one alternative embodiment, HV gate oxide 252 layer may be removed using a plasma etch process.

Next, referring to FIGS. 1 and 2J, an oxidation process is performed to oxidize the remaining portion of second cap layer 232 b and/or the first cap layer 232 a of multi-layer, cap layer 232, and optionally, a portion of second charge-trapping layer 230 b to form blocking oxide layer 260 overlying second charge-trapping layer 230 b (step 118). In one embodiment, the oxidation process is adapted to oxidize or consume first cap layer 232 a, or the remaining portion of second cap layer 232 b, or optionally a portion of second charge-trapping layer 230 b to form the blocking oxide layer 260 in the first region while simultaneously oxidizing at least a portion of substrate surface 216 overlaying channels 218 of I/O MOS 215 and LV MOS 212 to form I/O gate oxide 256 layer in the second region. In one embodiment, the oxidation process may also grow a layer of oxide at or around channel 218 of HV MOS 214 to increase thickness of HV gate oxide 252' layer. The oxidation process may include in-situ-steam-generation (ISSG), or other radical oxidation processes performed in a batch or single substrate processing chamber with or without an ignition event such as plasma. For example, in one embodiment blocking oxide layer 260 and I/O gate oxide 256 layer may be grown in a radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 700-800° C. at a pressure approximately in the range of 0.5-5 Torr to form radicals, such as, an OH radical, an $HO_2$ radical or an O diradical radicals at a surface of remaining second cap layer 232 b or first cap layer 232 a. The radical oxidation process may be carried out for a duration approximately in the range of 10-15 minutes to effect growth of blocking oxide layer 260 by oxidation and consumption of the multi-layer cap layer 232 and optionally a portion of the second charge-trapping layer 230 b having a thickness of from about 3 nm to about 4.5 nm, and I/O gate oxide 256 layer having a thickness of from about 5 nm to about 7 nm. In one embodiment, by controlling operation parameters in the I/O gate oxide 256 layer formation, targeted thickness of I/O gate oxide 256 layer may be achieved. The parameters may include time duration, temperature, pressure, reactants etc. of the ISSG or other radical oxidation processes. As will be explained in later sections, at least a portion of I/O gate oxide 256 layer remains in the finished device as I/O gate oxide 256 of I/O MOS transistor 215. In one embodiment, to withstand the relatively high operating voltage, desirable thickness of I/O gate oxide 252 layer may be targeted to be approximately between 50 Å to 70 Å, or other thicknesses. It will be understood that such a range is merely illustrative and is not meant to be limiting. In one embodiment, I/O gate oxide 256 layer may be formed, in the processes described in FIG. 2J, to be thicker than the desirable thickness. Excessive I/O gate oxide 256 layer may be removed in later processes, to achieve the desirable or final thickness of I/O gate oxide 256 of I/O MOS transistor 215.

Referring to FIG. 2J again, after I/O gate oxide 256 layer is formed, a patterned mask layer 258 may be formed on or overlying at least NV gate stack 236 in the first region 206, HV gate oxide 252' layer over channel 218 of HV MOS 214, and I/O gate oxide 256 layer over channel 218 of I/O MOS 215 in the second region 208 (step 120). The patterned mask layer 258 may include a photoresist layer patterned using standard lithographic techniques, a hard mask layer or other techniques known in the art.

Figure 2K:
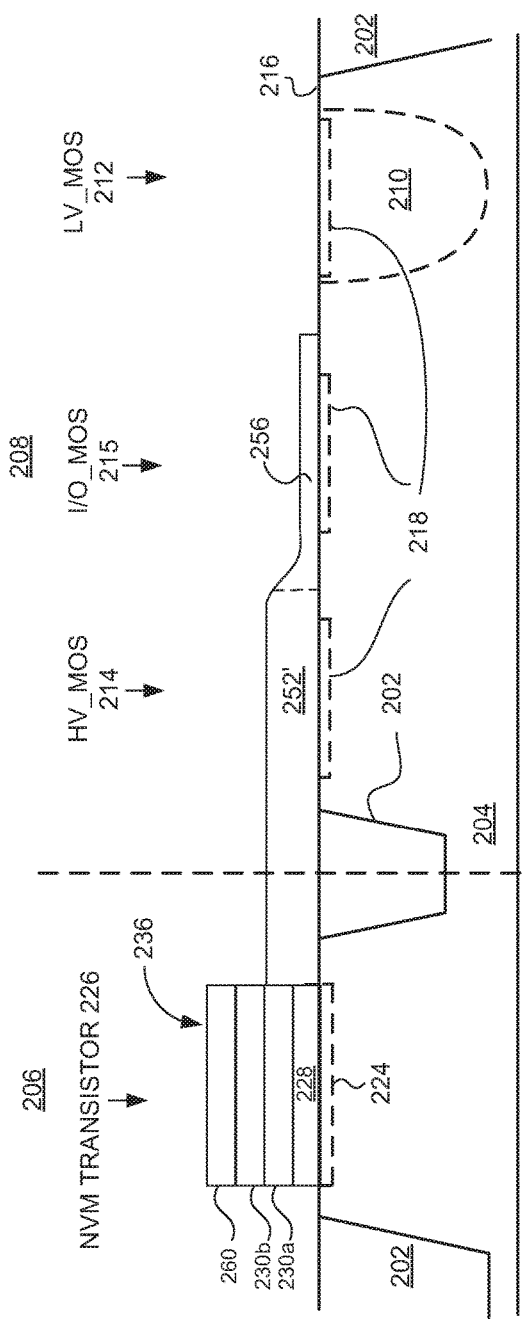

Next, referring to FIGS. 1 and 2K, I/O gate oxide 256 layer overlying at least channel 218 of LV MOS 212 in the second region 208 of substrate 204 is removed (step 120). After the oxide etch step, substrate surface 216 in the LV MOS 212 area may be exposed. In one exemplary embodiment, I/O gate oxide 256 layer may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, or any other similar hydrofluoric-based wet etching chemistry. In one alternative embodiment, I/O gate oxide 256 layer may be etched or removed using a the dry etch process including one or more separate steps to stop on substrate surface 216.

Figure 2L:
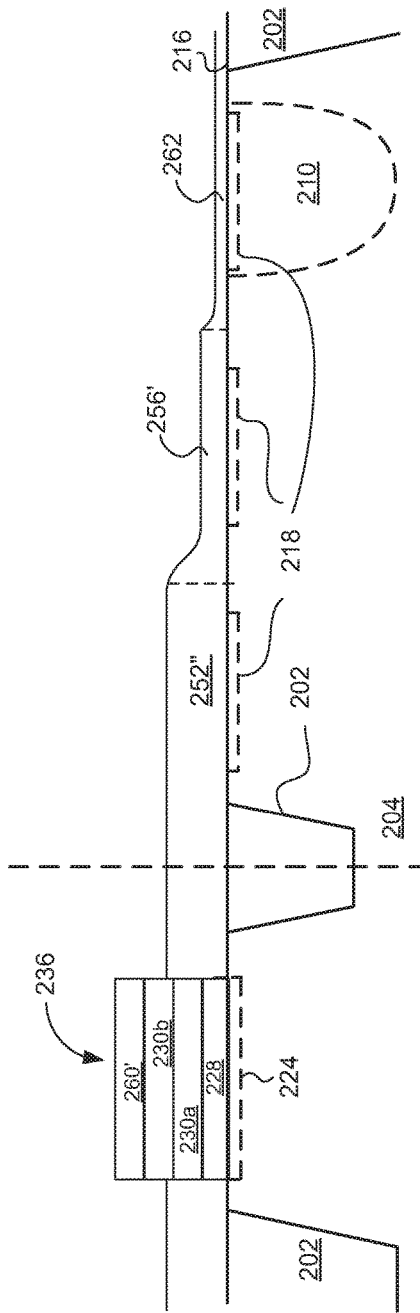

Next, referring to FIGS. 1 and 2L, an oxidation process is performed to form LV gate oxide 262 layer (step 122). In one embodiment, LV gate oxide 262 layer may be formed by radical oxidation processes, such as ISSG process, as described above. When LV gate oxide 262 layer is formed by ISSG, a thin LV gate oxide 262 layer, having a thickness from about 15 Å to about 30 Å, may be formed at or around the LV MOS 212 area. The same radical oxidation process may also add thickness to I/O gate oxide 256' layer at or around I/O MOS 215 area, HV gate oxide 252'' layer at or around HV MOS 214 area, and blocking dielectric 260' layer of NV gate stack 236. In one embodiment, by controlling operation parameters in the LV gate oxide 262 layer formation, targeted thickness of LV gate oxide 262 layer may be achieved. The parameters may include time duration, temperature, pressure, reactants etc. of the ISSG or other radical oxidation processes. As will be explained in later sections, at least a portion of LV gate oxide 262 layer remains in the finished device as LV gate oxide 262 of LV MOS transistor 212.

In one alternative embodiment, LV gate oxide 262 layer may be formed by RTO or conventional furnace oxidation. In such cases, thicknesses of blocking dielectric 260 layer of NV gate stack 236 may not be affected. In some embodiments a thin high dielectric constant or high-k dielectric material can be used in place of the silicon dioxide. The high-k dielectric material may include, but is not limited to, hafnium oxide, zirconium oxide, hafnium silicate, hafnium oxy-nitride, hafnium zirconium oxide and lanthanum oxide deposited by, for example, atomic layer deposition (ALD), physical vapor deposition (PVD), a chemical vapor deposition (CVD), a low pressure CVD (LPCVD) or a plasma enhanced CVD (PECVD) process.

In some embodiment, forming LV gate oxide 262 layer may also encompass the formation of a nitrogen-rich silicon oxide film by providing a nitridizing atmosphere to substrate 204. The term "nitrogen-rich" may be understood to mean a peak nitrogen concentration of between approximately 0.5 to 3.5 atomic percent (at %) or higher. In addition, the term "nitridizing atmosphere" may be understood to mean an atmosphere that provides for the formation of nitrogen-rich silicon oxide films. In some embodiments providing the nitridizing atmosphere to the substrate 204 may encompass introducing nitrous oxide ($N_2O$) into the torch region at a first temperature. Advantageously, this first temperature may be selected to be sufficiently high to promote an exothermic reaction which forms the nitridizing atmosphere. Subsequently the atmosphere formed is directed to the silicon wafers in the process chamber through the fluidic coupling between the chambers. In one embodiment, nitrogen-rich oxide film may also be formed in I/O gate oxide 256' layer, HV gate oxide 252'' layer, and/or blocking dielectric layer 260' as they are also exposed to the "nitridizing atmosphere" during step 122. Nitrogen-rich or nitrided silicon oxide films may provide a barrier to diffusion of dopants such as boron, in subsequent fabrication processes. Hence threshold voltage degradation of transistors formed using nitrogen-rich silicon oxide gate dielectrics may be reduced. Additionally, such nitrided silicon oxide films may have improved hot carrier resistance and dielectric integrity.

Figure 2M:
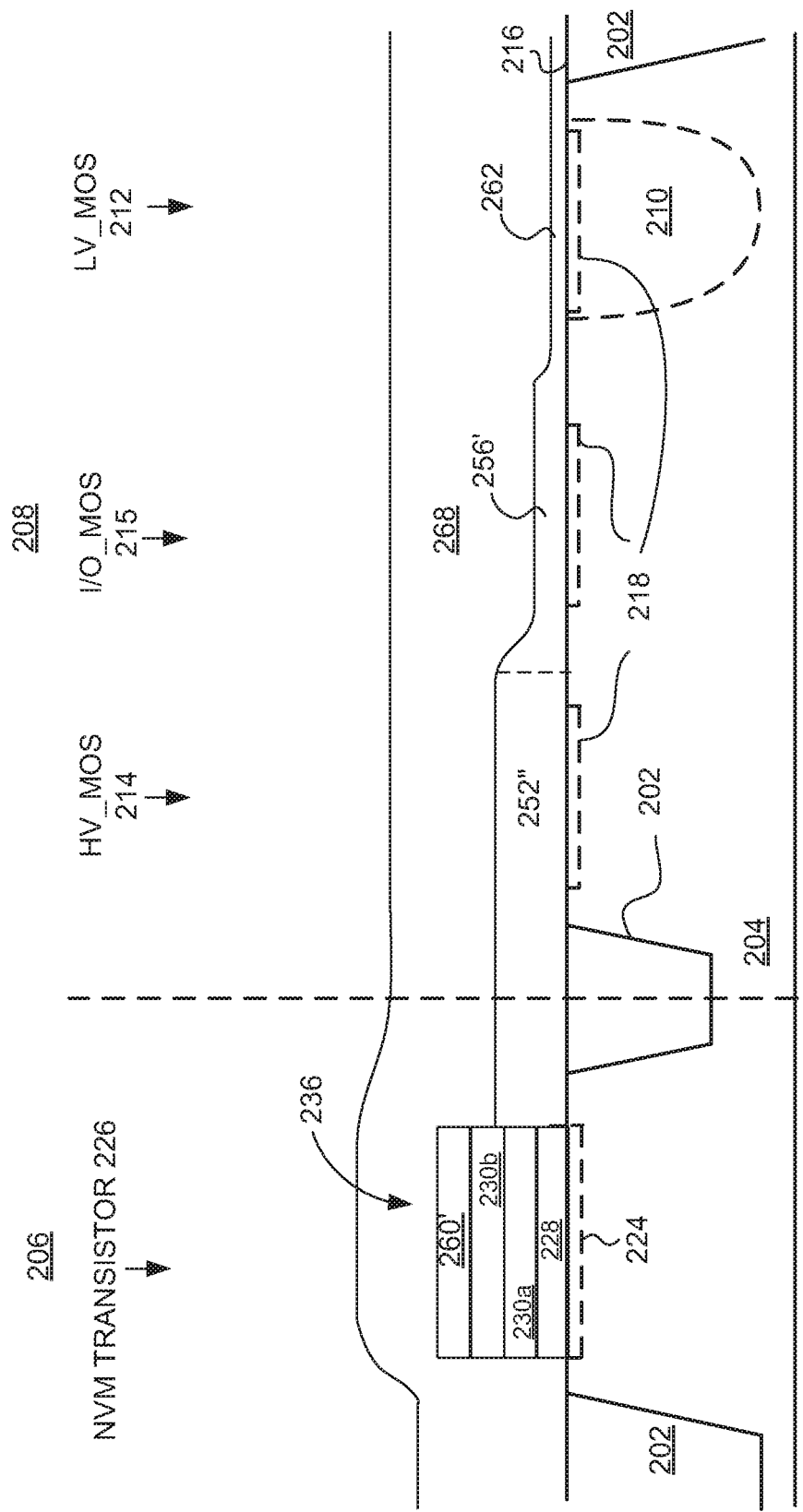
Figure 2N:
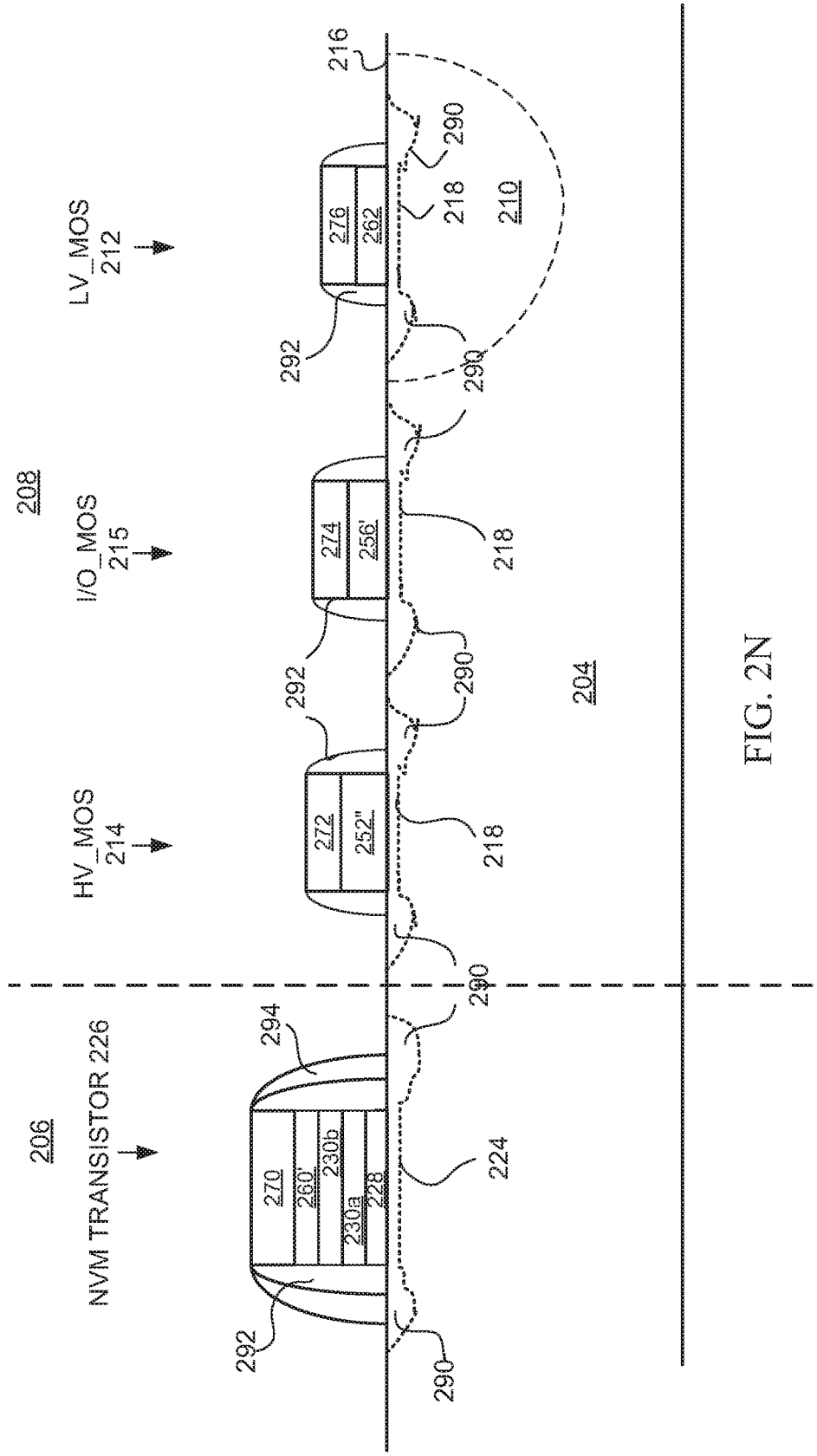
Figure 2O:
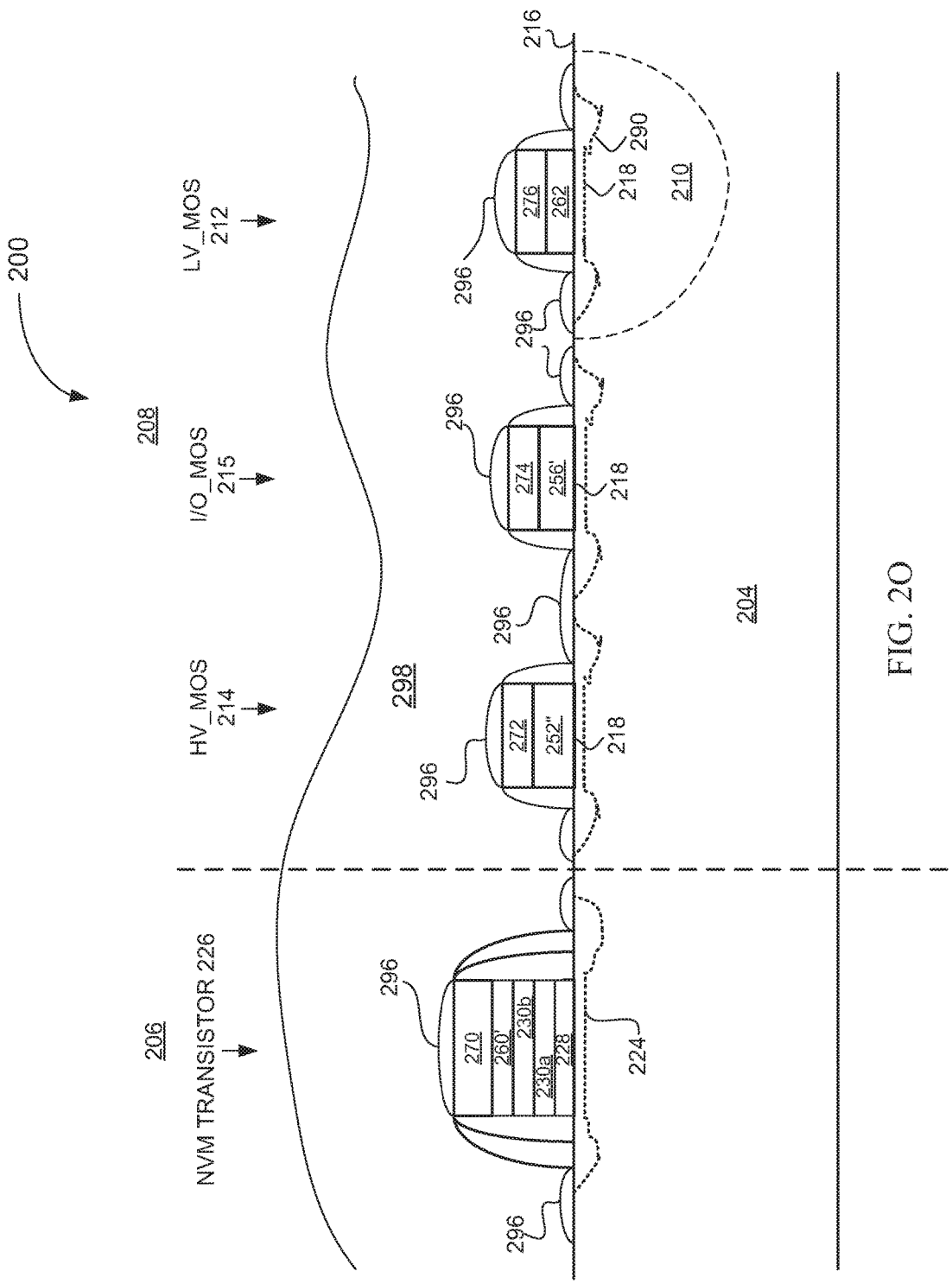

Referring to FIGS. 1 and 2M, gate layer 268 of any conducting or semiconducting material suitable for accommodating a biasing of the NVM transistor 226 and operation of HV MOS transistor 214, I/O MOS transistor 215, and LV MOS transistor 212, may be formed over NV gate stack 236 in the first region 206, and gate oxide layers 252'', 256' and 262 in the second region 208 (step 124). In some optional embodiments, prior to step 124, one or more etching or wet clean processes may be performed on blocking dielectric 260' layer, HV gate oxide 252'' layer, I/O gate oxide 256' layer, or LV gate oxide 262 layer to achieve respective desired thickness(es).

In one embodiment, the gate layer 268 may be formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt and nickel. In another embodiment, the gate layer 268 may be formed by a CVD process and composed of a single doped polysilicon layer, which may then be patterned to form control gates of the NVM transistor 226 and MOS transistors 214, 215, 212.

Referring to FIG. 2M again, gate layer 268 is subsequently patterned using a mask layer (not shown) and standard lithographic techniques to form gate 270 for NV gate stack 236 of NVM transistor 226, gate 272 for HV MOS transistor 214, gate 274 for I/O MOS transistor 215, and gate 276 for LV MOS transistor 212 (step 124). In one embodiment, gate 270 for NV gate stack 236 of NVM transistor 226, gate 272 for HV MOS transistor 214, gate 274 for I/O MOS transistor 215, and gate 276 for LV MOS transistor 212 may be formed concurrently. In alternative embodiments, the aforementioned gates may be formed consecutively, or in groups.

Referring to FIGS. 1 and 2N, a first spacer layer is deposited and etched to form first sidewall spacers 292 adjacent to the gates 272, 274, 276, of the MOS transistors 212, 215, 214, and gate 270 of NVM transistor 226, and one or more lightly-doped drain extensions (LDD 290) may be implanted adjacent to and extend under sidewall spacers 292 of one or more of the MOS transistors 212, 214, 215 (step 126).

Next, a SONOS LDD mask is formed over the substrate 204 and lightly-doped drain extensions (LDD 290) are implanted, adjacent to NVM transistor 226. Subsequently, a second spacer layer is deposited and etched to form second sidewall spacers 294 adjacent to NV gate stack 236, of the NVM transistor 226 (step 128).

In one or more alternative embodiments, fabrication steps as illustrated and described in FIGS. 1 to 2N may be adapted or modified to manufacture a floating gate based NVM transistor, instead of or additional of the SONOS based NVM transistor 226 in an integrated baseline CMOS process.

Referring to FIGS. 1 and 2O, with the NVM transistor 226, HV MOS transistor 214, I/O MOS transistor 215, and LV MOS transistor 212 substantially completed, source and drain implants are performed to form source and drain regions 290 for all transistors and a silicide process performed (step 130). As depicted, silicide regions 296 may be formed on the exposed gates 270, 272, 274, 276 and exposed source and drain regions 290. The silicide process may be any commonly employed in the art, typically including a pre-clean etch, cobalt or nickel metal deposition, anneal and wet strip.

Referring FIGS. 1 and 2O, optionally the method of fabricating memory cells including an embedded or integrally formed SONOS based NVM transistor and MOS transistor(s) further includes the step of forming a stress inducing layer or structure 298, such as a stress inducing nitride layer, over NV gate stack 236 of the NVM transistor 226 to increase data retention and/or to improve programming time and efficiency (step 132). In particular, inducing stress into the charge-trapping layer 230 of the NVM transistor 226 changes energy levels of charge traps formed therein, thereby increasing charge retention of the charge-trapping layer. In addition, forming a stress inducing structure 298, in or on the surface 216 of the substrate 204 proximal to, and preferably surrounding, a region of the substrate in which the channel 224 of NVM transistor 226 is formed will reduce the band gap, and, depending on the type of strain, increases carrier mobility. For example, tensile strain, in which inter-atomic distances in the crystal lattice of the substrate 204 are stretched, increases the mobility of electrons, making N-type transistors faster. Compressive strain, in which those distances are shortened, produces a similar effect in P-type transistors by increasing the mobility of holes. Both of these strain induced factors, i.e., reduced band gap and increased carrier mobility, will result in faster and more efficient programming of NVM transistor 226.

The strain inducing structure 298 may include a pre-metal dielectric (PMD) layer formed using a High Aspect Ratio Process (HARP™) oxidation process, a compressive or tensile nitride layer formed using a plasma enhanced chemical vapor deposition (PECVD) or a Bis-Tertiary Butyl Amino Silane (BTBAS) nitride layer.

In certain embodiments, such as that shown in FIG. 2O, the stress inducing structure 298 may also be formed over one or more of the MOS transistor (HV, I/O, or LV MOS) to induce strain in the channel(s) 218 of the MOS transistor(s) 212, 214, 215.

Finally, the standard or baseline CMOS process flow is continued to substantially complete the front end device fabrication (step 134), yielding the structure shown in FIG. 2O. FIG. 2O is a block diagram illustrating a cross-sectional view of a portion of a finished memory cell including an embedded SONOS based NVM transistor and MOS transistors fabricated according to the method of FIGS. 1 and 2A-2N.

FIG. 2O illustrates a portion of the completed embedded SONOS based NVM device 200 including one or more SONOS transistor or NVM transistor 226, HV MOS transistor 214, I/O MOS transistor 215, and LV MOS transistor 212, all formed within a single semiconductor die or a single substrate 204. In one embodiment, blocking dielectric 260' may include a thickness of from about 40 Å-45 Å. As previously described, the final thickness of blocking dielectric 260' is achieved by the dual oxidation process in step 118 (illustrated in FIG. 2K), possibly by the subsequent LV gate oxide formation in step 122 (illustrated in FIG. 2J), and any subsequent cleaning processes.

In one embodiment, HV MOS 214 may require a relatively thick HV gate oxide 252" that may have a thickness of from about 120 Å-150 Å. In one embodiment, the final thickness of HV gate oxide 252" may be achieved by the RTO or furnace oxidation process in step 114 (illustrated in FIG. 2H). Subsequently, the thickness of HV gate oxide 252" may be further enhanced possibly by dual oxidation process in step 118 (illustrated in FIG. 2K), and by the subsequent LV gate oxide formation in step 122 (illustrated in FIG. 2J), and modified by wet cleaning process(es). As discussed earlier, HV gate oxide 252" must be thick enough to withstand high operation voltages, especially during programming and erasing of NVM transistor 226, which may be in a range of 4.5 V-12 V. In one embodiment, I/O gate oxide 256' may include a thickness of about 50 Å-55 Å, to operate potentially of I/O voltages in a range of 1.6 V-3.6 V. As previously described, the final thickness of I/O gate oxide 256' is achieved by the dual oxidation process in step 118 (illustrated in FIG. 2K), and possibly by the subsequent LV gate oxide formation in step 122 (illustrated in FIG. 2J), and cleaning process(es). In one embodiment, LV gate oxide 262 may have a thickness of from about 15 Å-20 Å for various operations in an operation range of 0.8 V-1.4 V.

In one embodiment, nitrogen-rich oxide film (not shown in FIG. 2O) may also be formed in LV gate oxide 262, I/O gate oxide 256', HV gate oxide 252", and/or blocking dielectric 260' as they may be exposed to the "nitridizing atmosphere" during the LV gate oxide formation step 122. The nitrogen-rich oxide film may be disposed close to substrate surface 216, or the bottom of blocking dielectric 260'.

Figure 3:
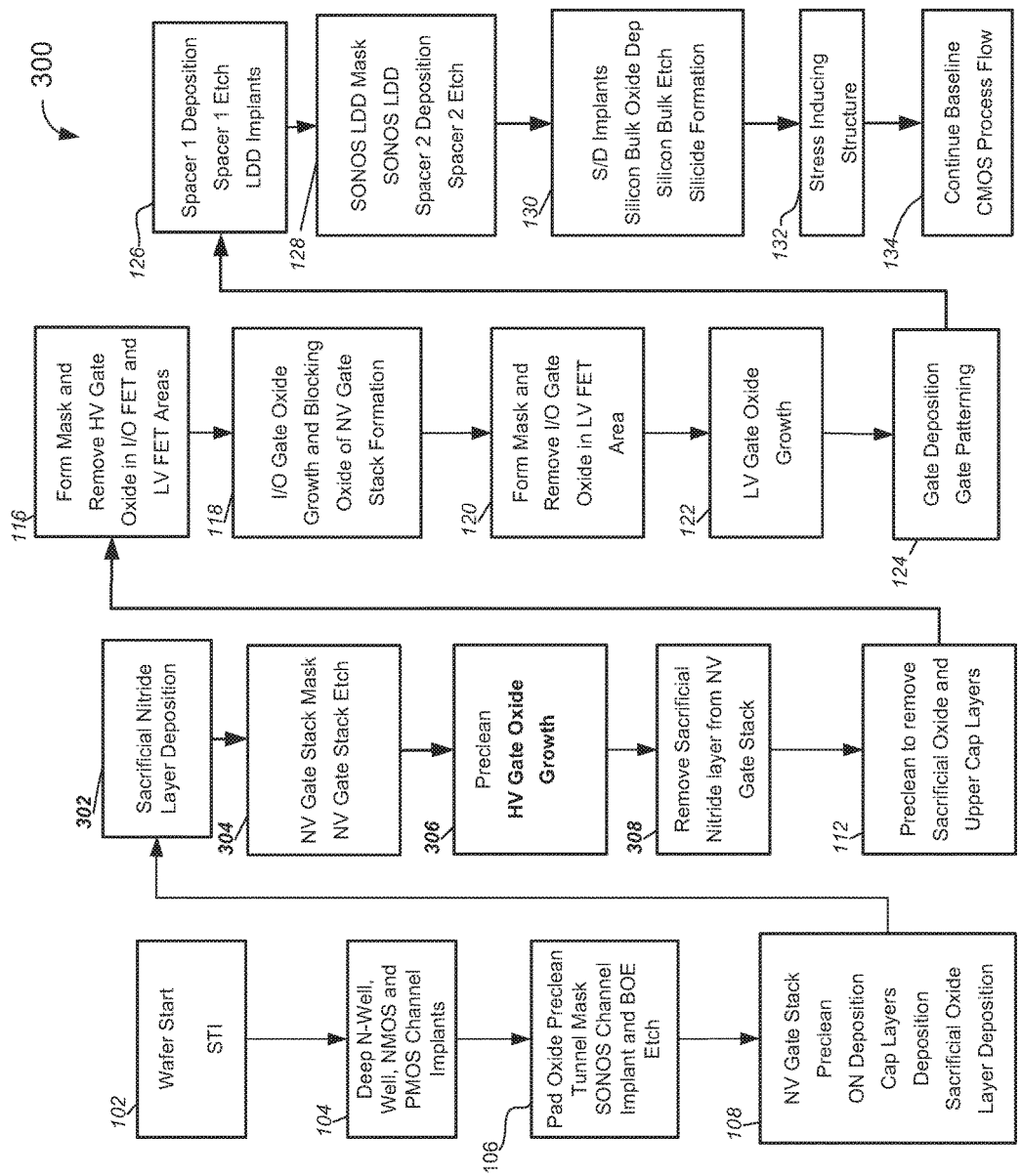
FIG. 3 is a flowchart illustrating another embodiment of a method for fabricating a memory cell including an embedded SONOS based NVM transistor and MOS transistors of a finished memory cell illustrated in FIG. 2O.
Figure 4A:
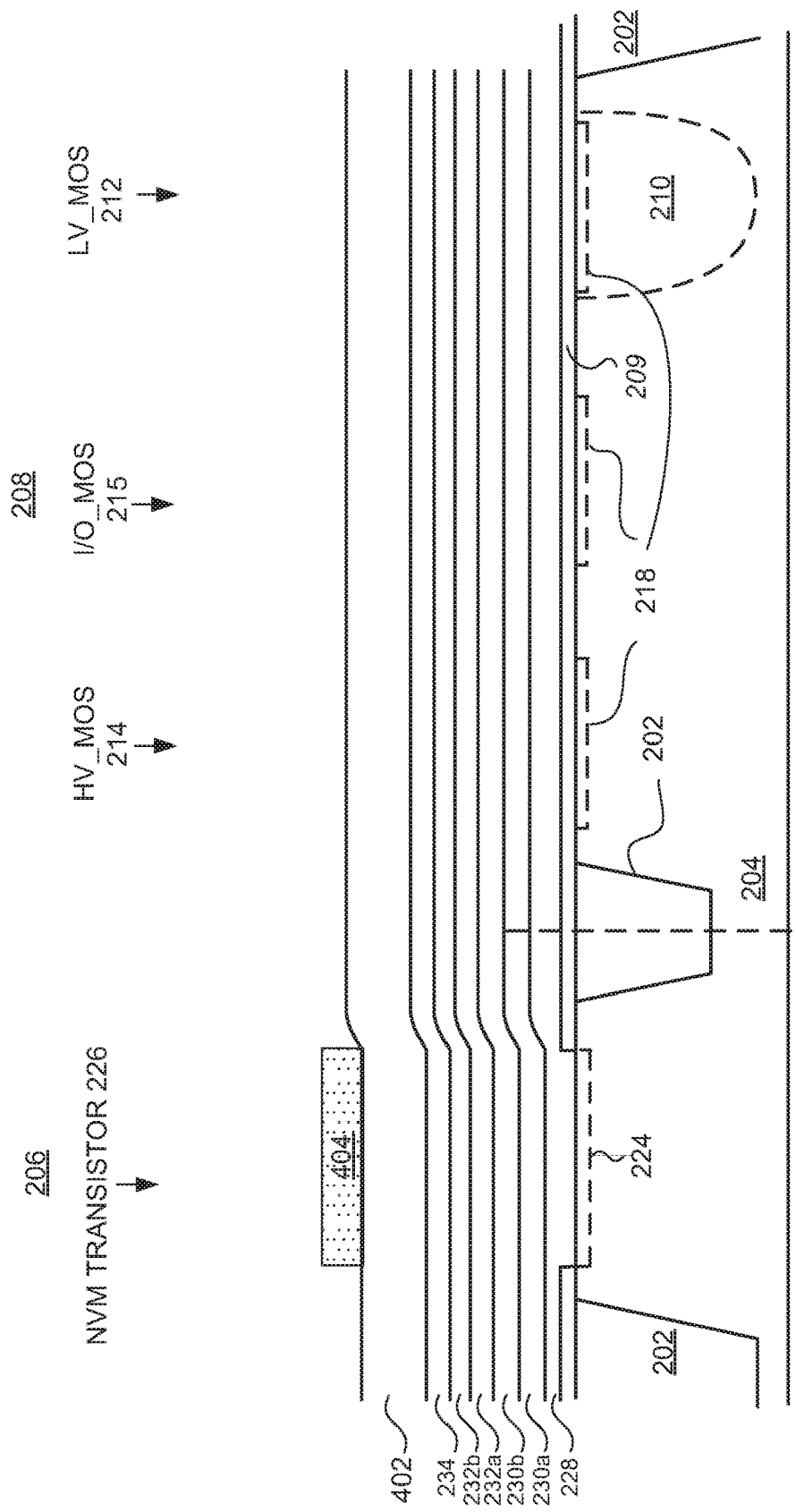
FIGS. 4A-4D are representative diagrams illustrating cross-sectional views of a portion of a memory cell during fabrication of the memory cell according to the method of FIG. 3.

FIG. 3 is a flow chart that describes a first alternative embodiment 300 to fabricate the embedded SONOS based NVM device 200, as best illustrated in FIG. 2O. Referring to FIG. 3, the fabrication process begins in a similar manner as the embodiment described in FIGS. 1 and 2A-2E (steps 102-108). As previously described, tunnel dielectric 228 layer, first and second charge-trapping layers 230 *a* and *b*, first and second cap layers 232 *a* and *b*, sacrificial oxide layer 234 are sequentially formed overlying substrate 204 in the first and second regions 206 and 208. Referring to FIGS. 3 and 4A, sacrificial nitride layer 402 is formed overlying sacrificial oxide layer 234 (step 302). In one embodiment, sacrificial nitride layer 402 is formed by conventional process, such as CVD using $N_2O/NH_3$ and $DCS/NH_3$ gas mixtures or PVD, to achieve a thickness of from about 50 Å-200 Å.

Figure 4B:
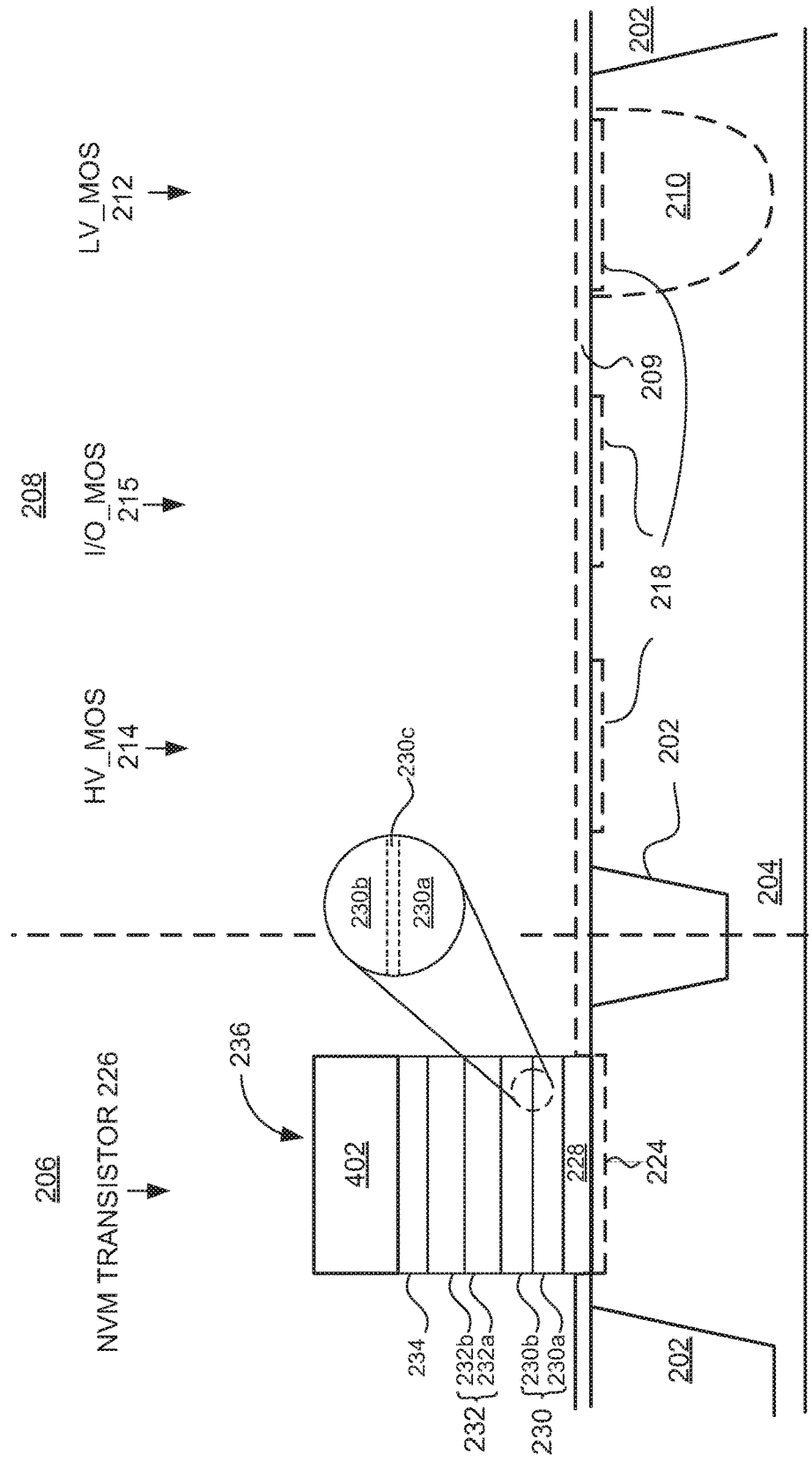

Referring to FIG. 4A still, a patterned mask layer 404 is formed on or overlying the sacrificial nitride layer 402, and referring to FIG. 4B, sacrificial nitride layer 402, sacrificial oxide layer 234, multi-layer cap layer 232 and multi-layer charge-trapping layer 230, and tunnel dielectric layer 228 are etched or patterned to form NV gate stack 236. In one embodiment, NV gate stack 236 is disposed overlying channel 224 of NVM transistor 226 in the first region 206. The etching or patterning process may further remove various dielectric layers of NV gate stack 236 from the second region 208 of substrate 204 (step 304). The patterned mask layer 404 may include a photoresist layer patterned using standard lithographic techniques, and the NV gate stack 236 layers in second region 208 may be etched or removed using a dry etch process including one or more separate steps to stop on a surface of the tunnel dielectric 228 or pad oxide 209.

Referring to FIGS. 3 and 4B, a cleaning process is performed to removes any oxide, such as oxide in tunnel dielectric 228 and/or pad oxide 209, remaining in the first region 206 beyond NV gate stack 236, and in second region 208 to prepare substrate 204 for HV gate oxide growth (step 306). In one alternative embodiment, pad oxide 109 is not remove entirely or at all (shown as dotted line in FIG. 4B). In one exemplary implementation, residual tunnel dielectric 228 and/or pad oxide 209 may be removed in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry.

Figure 4C:
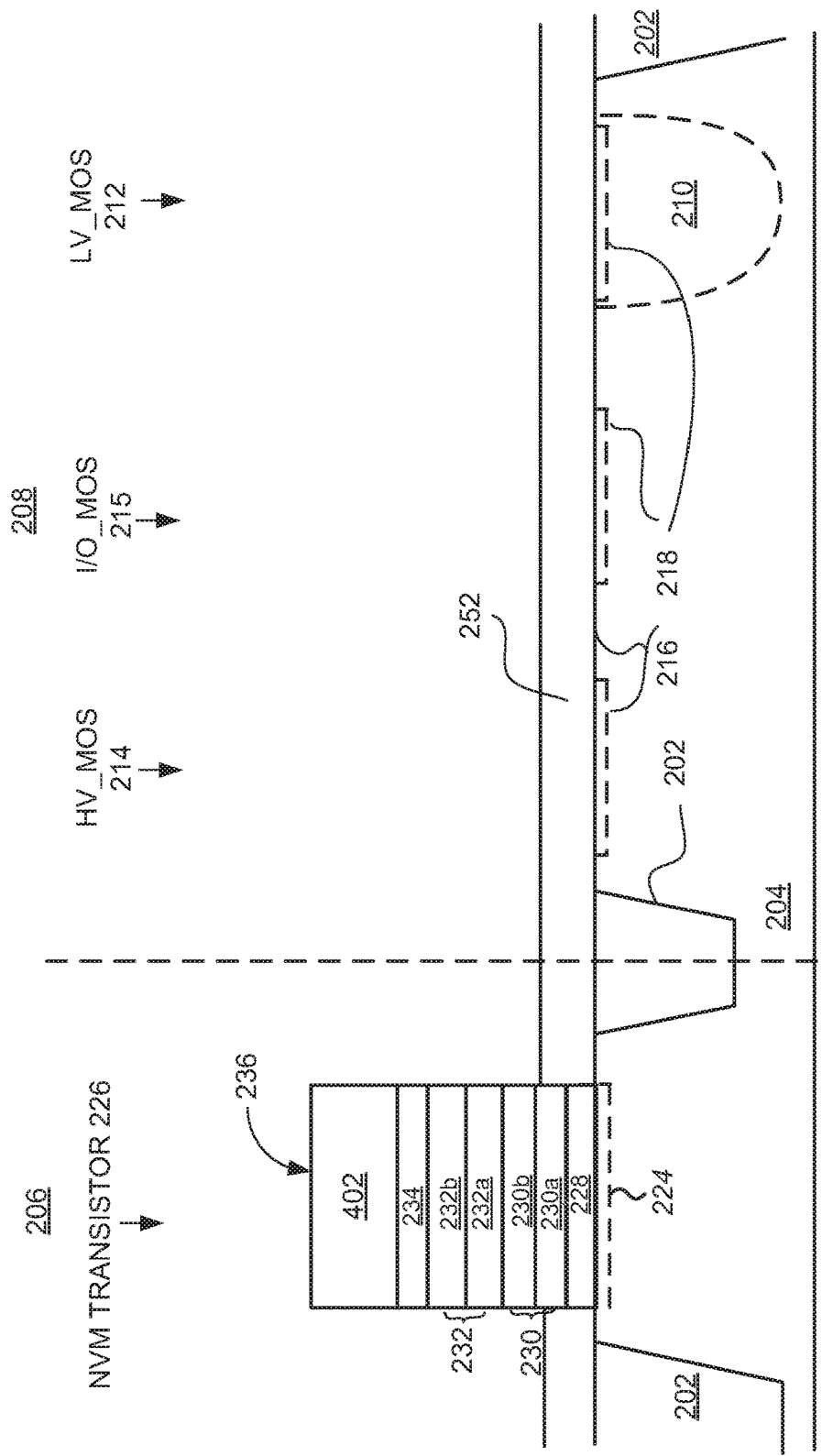

Next, referring to FIGS. 3 and 4C, HV gate oxide 252 layer is formed over substrate 204 (step 306), either directly or indirectly. In one embodiment, as best illustrated in FIG. 4C, the process starts when pad oxide 209 is completely or partially removed in a pad oxide preclean process. After pad oxide 209 is removed, either partially or completely, HV gate oxide 252 layer is formed by a rapid thermal dry oxidation (RTO) process, a conventional or furnace oxidation process, a chemical vapor deposition process (CVD), or other non-radical oxide forming processes known in the art, or a combination thereof. In one embodiment, HV gate oxide 252 layer may be grown to a thickness of from about 100 Å-200 Å. In one embodiment, remaining pad oxide 209 after the pre-clean process may become part of the later grown HV gate oxide 252 layer.

It is the understanding that it may take an extended period for the oxidation process (RTO or furnace oxidation) to grow a relatively thick HV gate oxide 252 layer. During the long oxidation process, it may effect oxide growth in tunnel dielectric 228 of NV gate stack 236. As a result, tunnel dielectric 228 may have an unexpectedly thick structure which may adversely affect the operations of the eventual NVM transistor 226. In one embodiment, the electrical performance of NVM transistor 226, such as programming/erasing by tunneling, may be degraded. The relatively thick sacrificial nitride 402 (50 Å-200 Å) disposed at the top of NV gate stack 236 may help minimize or eliminate the encroachment of oxidizing species, such as $H_2O$, in or around tunnel dielectric 228, and therefore prevent any degradation of the electrical characteristics of the eventual NVM transistor 226. Another potential issue with the relatively long HV gate oxide 252 layer growth is that moisture in STIs 202 oxide may also creep in under NV gate stack 236 and increase the tunnel dielectric 228 thickness. Both these mechanisms may lead to significant increase in tunnel dielectric 228 thickness, resulting in degradation of the tunneling of electrons/holes during programming/erasing, and the Program/Erase Vts and Vt window of the eventual NVM transistor 206.

Figure 4D:
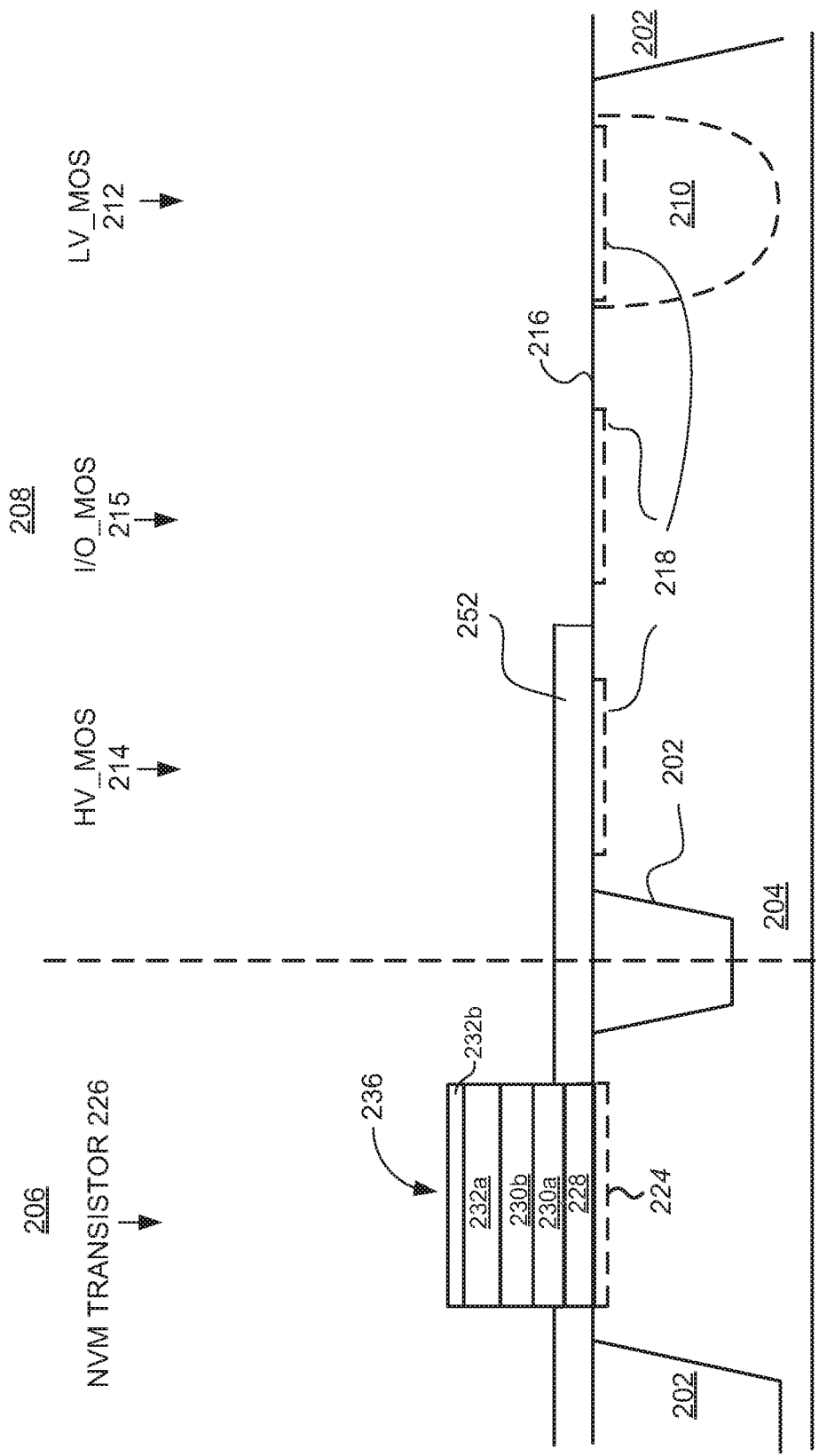

Next, referring to FIGS. 3 and 4D, after HV gate oxide 252 layer has been grown to a desired thickness, sacrificial nitride 402 is removed from NV gate stack 236 (step 308). In one embodiment, sacrificial nitride 402 may be removed by wet etch using hot phosphoric acid. The sacrificial nitride 402 etch is extremely selective to oxide, and may remove very small amount of oxide from NV gate stack 236 and HV gate oxide 252 layer.

Next, the fabrication process may continue on to remove the sacrificial oxide 234 and at least a top portion of second cap layer 232 b, as best illustrated in FIG. 4C or FIG. 2G (step 112). Subsequently, the fabrication process may follow the sequence, steps 116-134, as shown in FIG. 1 to complete the final embodiment of embedded SONOS based NVM device 200 in FIG. 2O.

Figure 5:
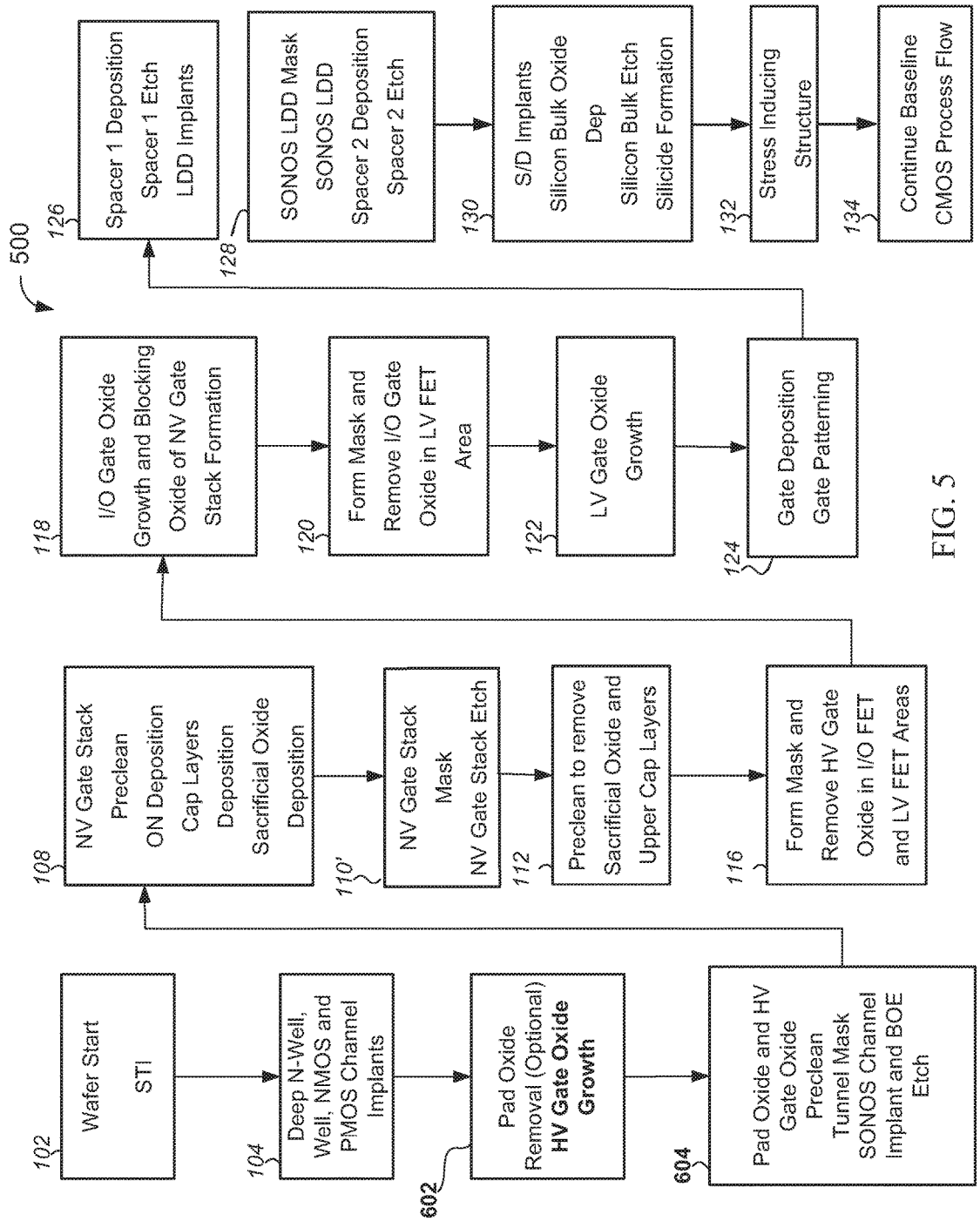
FIG. 5 is a flowchart illustrating another embodiment of a method for fabricating a memory cell including an embedded SONOS based NVM transistor and MOS transistors of a finished memory cell illustrated in FIG. 2O.

FIG. 5 is a flow chart that describes a second alternative embodiment 500 to fabricate the embedded SONOS based NVM device 200, as best illustrated in FIG. 2O. Referring to FIG. 5, the fabrication process begins in a similar manner as the embodiment described in FIGS. 1 and 2A-2B (steps 102-104). The main difference of this embodiment is that HV gate oxide 252 layer is formed prior to the formation of dielectric layers of NV gate stack 236.

Figure 6A:
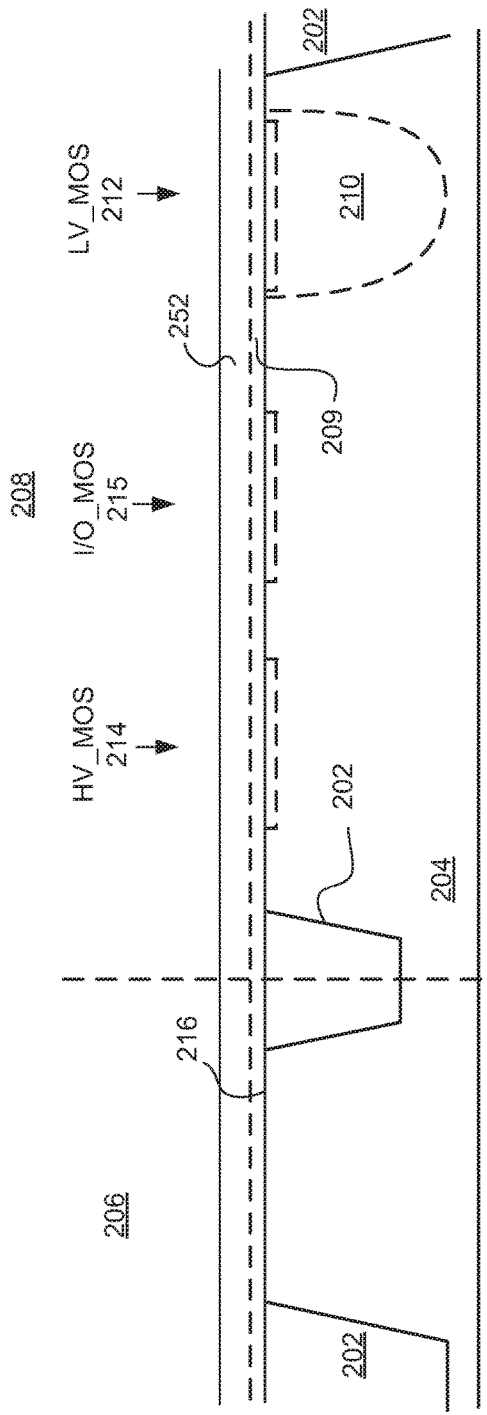
FIGS. 6A-6E are representative diagrams illustrating cross-sectional views of a portion of a memory cell during fabrication of the memory cell according to the method of FIG. 5.
Figure 6B:
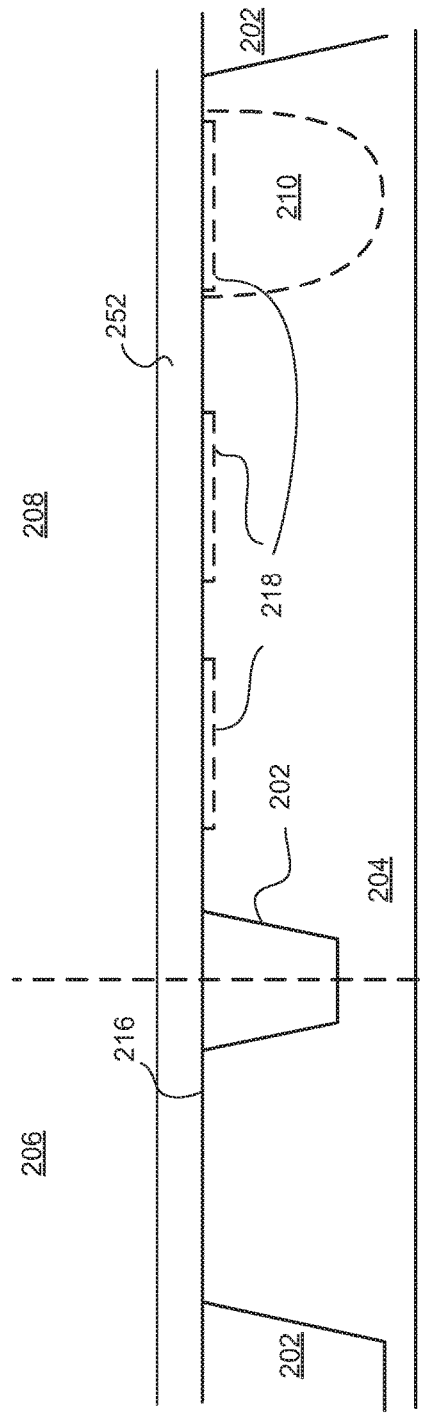

Next, referring to FIG. 5 and FIG. 6A, HV gate oxide 252 layer is formed on substrate 204 (step 602), either directly or indirectly. in one embodiment, as best illustrated in FIG. 6A, the process starts when pad oxide 209 is completely removed in a pad oxide preclean process. The pad oxide preclean may involve, for example a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. After pad oxide 209 is removed, HV gate oxide 252 layer may be formed by a rapid thermal dry oxidation (RTO) process, a conventional or furnace oxidation process, a rapid and radical wet oxidation process such as in-situ steam generation (ISSG), a chemical vapor deposition process (CVD), or other oxide forming processes known in the art, or a combination thereof. In one embodiment, since NV gate stack 238 is yet to be formed, radical oxidation processes, such as ISSG, may be employed as it will not oxidize nitride in NV gate stack 236, as in step 114 of FIG. 1 or step 306 of FIG. 3.

In one embodiment, as an example, the oxidation process starts with dry RTO performed in a batch or single substrate processing chamber with or without an ignition event such as plasma. For example, the device is subjected to a rapid thermal oxidation process involving flowing oxygen ($O_2$) gas into a processing chamber. The $O_2$ gas is permitted to react at a temperature approximately in the range of 1000-1100° C. at a pressure approximately in the range of 0.5-5 Torr. to form HV gate oxide 252 layer. In one embodiment, HV gate oxide 252 layer is grown, by oxidizing silicon substrate 204, on at least a portion of the surface 216 of substrate 204. In one alternative embodiment, RTO process may be substituted with a rapid molecular oxidation (dry or wet) which is a non-radical oxidation process. In another embodiment, HV gate oxide 252 layer is formed by a wet rapid and radical oxidation process, such as in-situ steam generation (ISSG). The wet rapid and radical oxidation may be performed in a batch or single substrate processing chamber with or without an ignition event such as plasma. For example, in one embodiment, HV gate oxide 252 layer may be grown in a wet radical oxidation process involving flowing hydrogen ($H_2$) and oxygen ($O_2$) gas into a processing chamber at a ratio to one another of approximately 1:1 without an ignition event, such as forming of a plasma, which would otherwise typically be used to pyrolyze the $H_2$ and $O_2$ to form steam. Instead, the $H_2$ and $O_2$ are permitted to react at a temperature approximately in the range of 1000-1100° C. at a pressure approximately in the range of 0.5-10 Torr. to form radicals, such as, an OH radical, an $HO_2$ radical or an O diradical radicals. The oxidation process is carried out for a duration approximately in the range of 1-5 minutes for a single substrate using an ISSG process, or 30-120 minutes for a batch furnace process to effect growth of HV gate oxide 252 layer. During the period, HV gate oxide 252 layer is grown in both the first and second regions 206 and 208. In alternative embodiments, wet rapid and radical oxidation may be substituted by processes such as chemical vapor deposition (CVD), or other radical oxidation processes performed in a batch or single substrate processing chamber with or without an ignition event such as plasma as long as oxide will be grown or deposited to form HV gate oxide 252 layer. In one embodiment, by controlling operation parameters in the HV gate oxide 252 layer formation, targeted thickness of HV gate oxide 252 layer may be achieved. The parameters may include time duration, temperature, pressure, reactants etc. of the RTO, ISSG, furnace oxidation, and CVD processes. As will be explained in later sections, at least a portion of HV gate oxide 252 layer remains in the finished device as HV gate oxide 252 of HV MOS transistor 214. In one embodiment, to withstand the relatively high operating voltage, desirable thickness of HV gate oxide 252 layer may be targeted to be approximately between 100 Å-200 Å, or other thicknesses. It will be understood that such a range is merely illustrative and is not meant to be limiting. In one embodiment, HV gate oxide 252 layer may be formed, in the processes described in FIG. 6A, to be thicker or thinner than the desirable thickness. Excessive or inadequate HV gate oxide 252 layer may be removed or added in later processes to achieve the desirable or final thickness of HV gate oxide 252 of HV MOS transistor 214.

Alternatively, HV gate oxide 252 layer may be formed over at least a bottom portion of pad oxide 209 and substrate 204. As best illustrated in FIG. 2D, pad oxide 209 is not completely removed during the pad oxide preclean process, as previously described. In one embodiment, the pad oxide preclean process is omitted. In another embodiment, the pad oxide preclean process is carried out but does not remove the entirety of pad oxide 209. HV gate oxide 252 layer may then be formed in the aforementioned processes at least over the remaining or bottom layer of pad oxide 209. In both embodiments, remaining pad oxide 209 becomes a part of the finished HV gate oxide 252 layer. In one embodiment, operation parameters of the pad oxide preclean process and the gate oxide formation process may be configured to achieve the combined thickness of HV gate oxide 252 layer. As previously discussed, the combined thickness of HV gate oxide 252 layer may be greater or less than the desirable or final gate thickness, and excessive HV gate oxide 252 layer may be removed or added in later processes. In one embodiment, since pad oxide 209 and HV gate oxide 252 layer are formed separately and individually, they may be different chemically, in stoichiometric composition and ratio, and/or physically. Moreover, there may be an interface (not shown) between pad oxide 209 and the later grown/deposited HV gate oxide 252 layer in the combined structure.

Figure 6C:
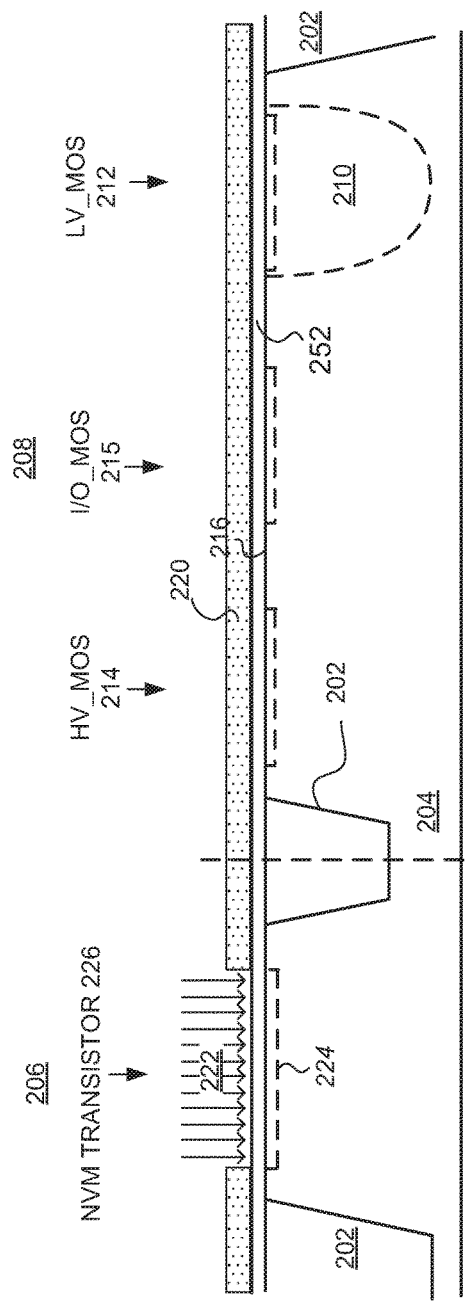

Next, referring to FIGS. 5 and 6C, a patterned tunnel mask 220 is formed on or overlying HV gate oxide 252 layer, ions (represented by arrows 222) of an appropriate, energy and concentration are implanted through a window or opening in tunnel mask 220 to form a channel 224 for NVM transistor 226 in first region 206, and tunnel mask 220 and HV gate oxide 252 layer in at least the window removed (step 604). Tunnel mask 220 may include a photoresist layer, or a hard mask formed, from a patterned nitride or silicon-nitride layer.

In one embodiment, channel 224 for NVM transistor 226 may be a deep indium doped channel implanted with indium (In) at an energy of from about 50 kilo-electron volts (keV) to about 500 keV, and a dose of from about 5e11 $cm^{-2}$ to about 1e13 $cm^{-2}$ to form an n-channel NVM transistor 226. In one embodiment, implanting indium to form channel 224 of NVM transistor 226 improves the threshold voltage (VT) uniformity of the finished NVM transistor from a sigma of VT from about 150 millivolts (mV) to about 70-80 mV. Optionally or additionally, a shallow doped channel is implanted with arsenic at an energy about 20 keV and a dose of from about 5e11 $cm^{-2}$ to about 1e13 $cm^{-2}$ at channel 224. Alternatively, $BF_2$ may be implanted to form an n-channel NVM transistor, or arsenic or phosphorous implanted to form a p-channel NVM transistor. In one alternative embodiment, channel for NVM transistor 226 may also be formed concurrently with channels 218 of the MOS transistors 212, 214, 215.

Figure 6D:
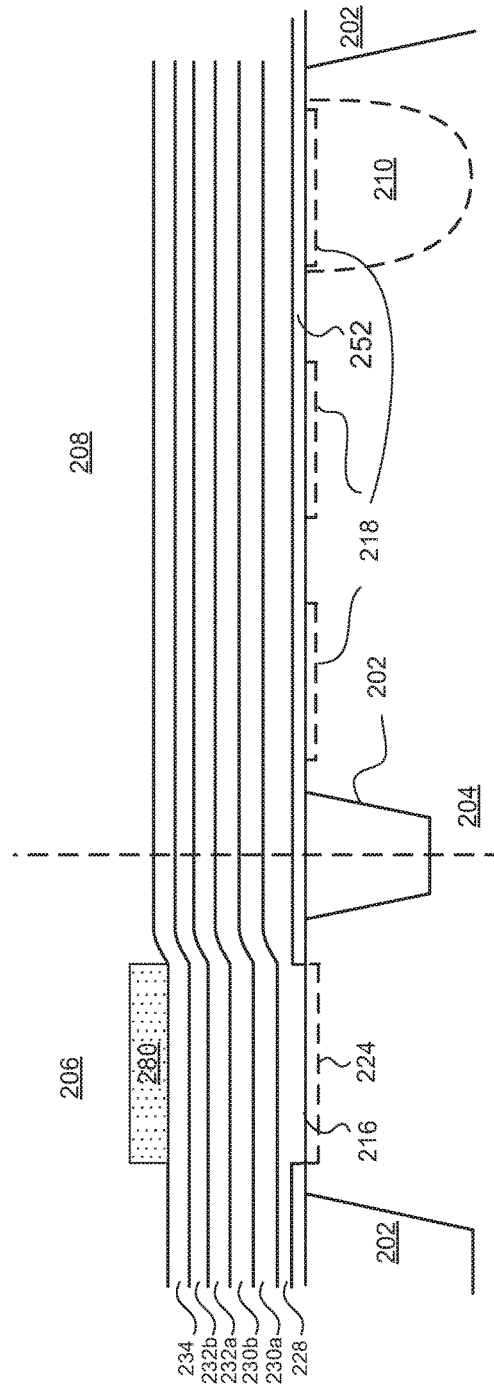

In one embodiment, as illustrated in FIG. 6D, HV gate oxide 252 layer in the window or opening in the tunnel mask 220 may be removed, for example in a wet clean process using a 10:1 buffered oxide etch (BOE) containing a surfactant. Alternatively, the wet clean process can be performed using a 20:1 BOE wet etch, a 50:1 hydrofluoric (HF) wet etch, a pad etch, or any other similar hydrofluoric-based wet etching chemistry. Subsequently or concurrently, tunnel mask 220 includes photoresist material may be ashed or stripped using oxygen plasma. Alternatively, hard tunnel mask 220 may be removed using a wet or dry etch process.

Next, referring to FIG. 1 and FIG. 6D, the surface 216 of wafer 204 is cleaned or precleaned, a number of dielectric layers formed or deposited, a mask formed on or overlying the dielectric layers, and the dielectric layers etched to form a NV gate stack 236 in first region 206 (step 108). The preclean may be a wet or dry process. In one embodiment, it may be a wet process using HF or standard cleans (SC1) and (SC2), and is highly selective to the material of wafer 204. In one embodiment, SC1 is typically performed using a 1:1:5 solution of ammonium hydroxide ($NH_4OH$), hydrogen peroxide ($H_2O_2$) and water ($H_2O$) at 30° C. to 80° C. for about 10 minutes. In another embodiment, SC2 is a short immersion in a 1:1:10 solution of HCl, $H_2O_2$ and $H_2O$ at about 30° C. to 80° C.

Next, referring to FIG. 6D, a number dielectric layers including tunnel dielectric 228, multi-layer charge-trapping layer 230, multi-layer cap layer 232, sacrificial oxide 234, may be disposed in the first and second regions 206 and 208 (step 108). One of the differences between the embodiment in FIG. 6D and FIG. 2E is that tunnel dielectric 228 is formed over HV gate oxide 252 layer, instead of pad oxide 209 in the second region 208.

Figure 6E:
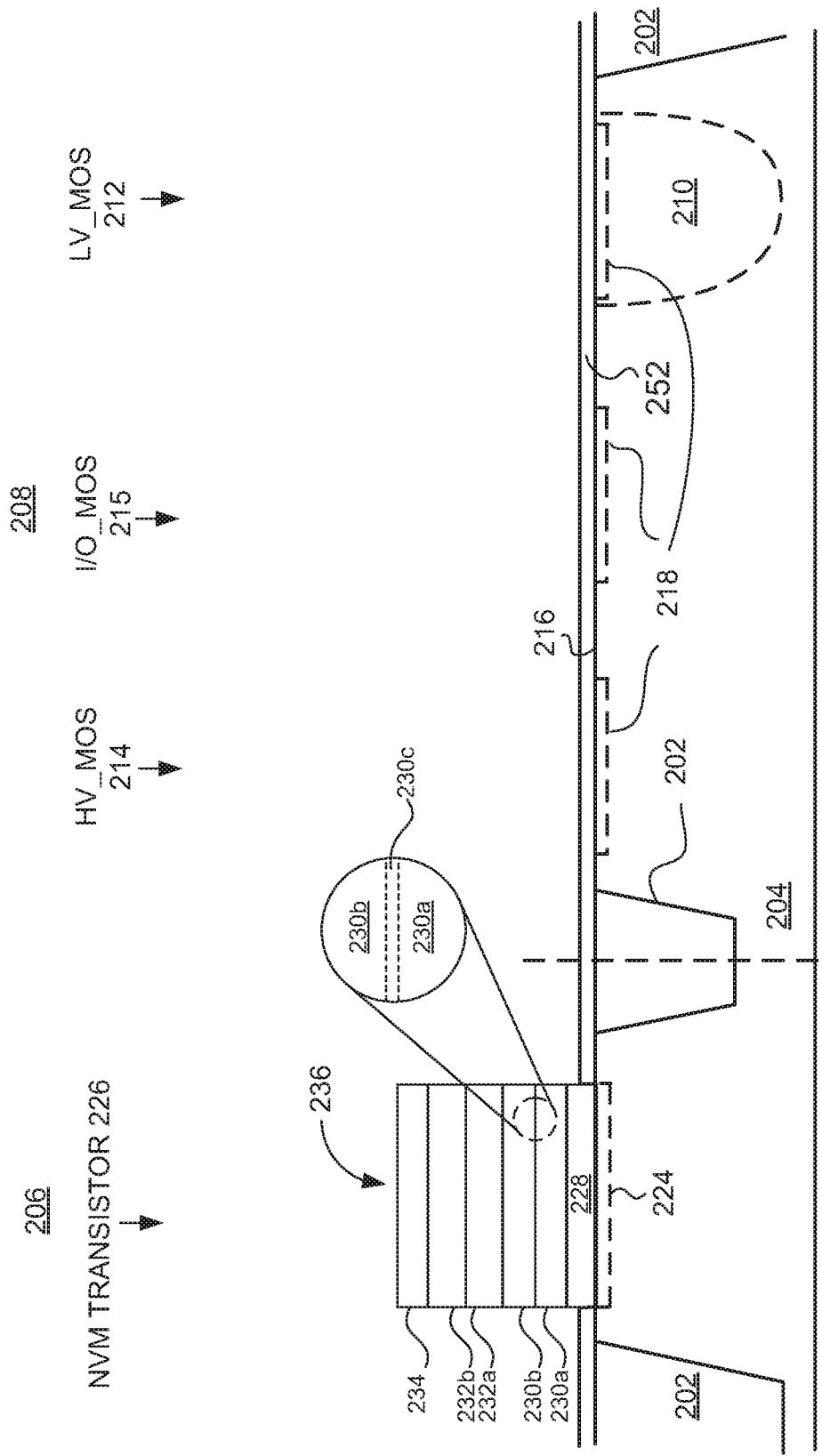

Next, referring to FIGS. 6D and 6E, a mask 280 may be formed on or overlying the dielectric layers, and the dielectric layers may then be etched to form NV gate stack 236 in the first region 206 (step 110'). The process step is very similar to step 110 in FIG. 1. One of the main differences are that the patterning step may stop at a top surface of HV gate oxide 252 layer, which was already formed at least in the second region 208, instead of pad oxide 209. In one embodiment, HV gate oxide 252 layer will become at least a portion of HV gate oxide 252 of the eventual HV MOS transistor 214, as illustrated in FIG. 20.

Next, the fabrication process may continue on to remove the sacrificial oxide 234 and at least a top portion of second cap layer 232 b, as best illustrated in FIG. 2G (step 112). Subsequently, the fabrication process may follow the sequence, steps 116-134, as shown in FIG. 1 to complete the final embodiment of embedded SONOS based NVM device 200 in FIG. 20.

Figure 7:
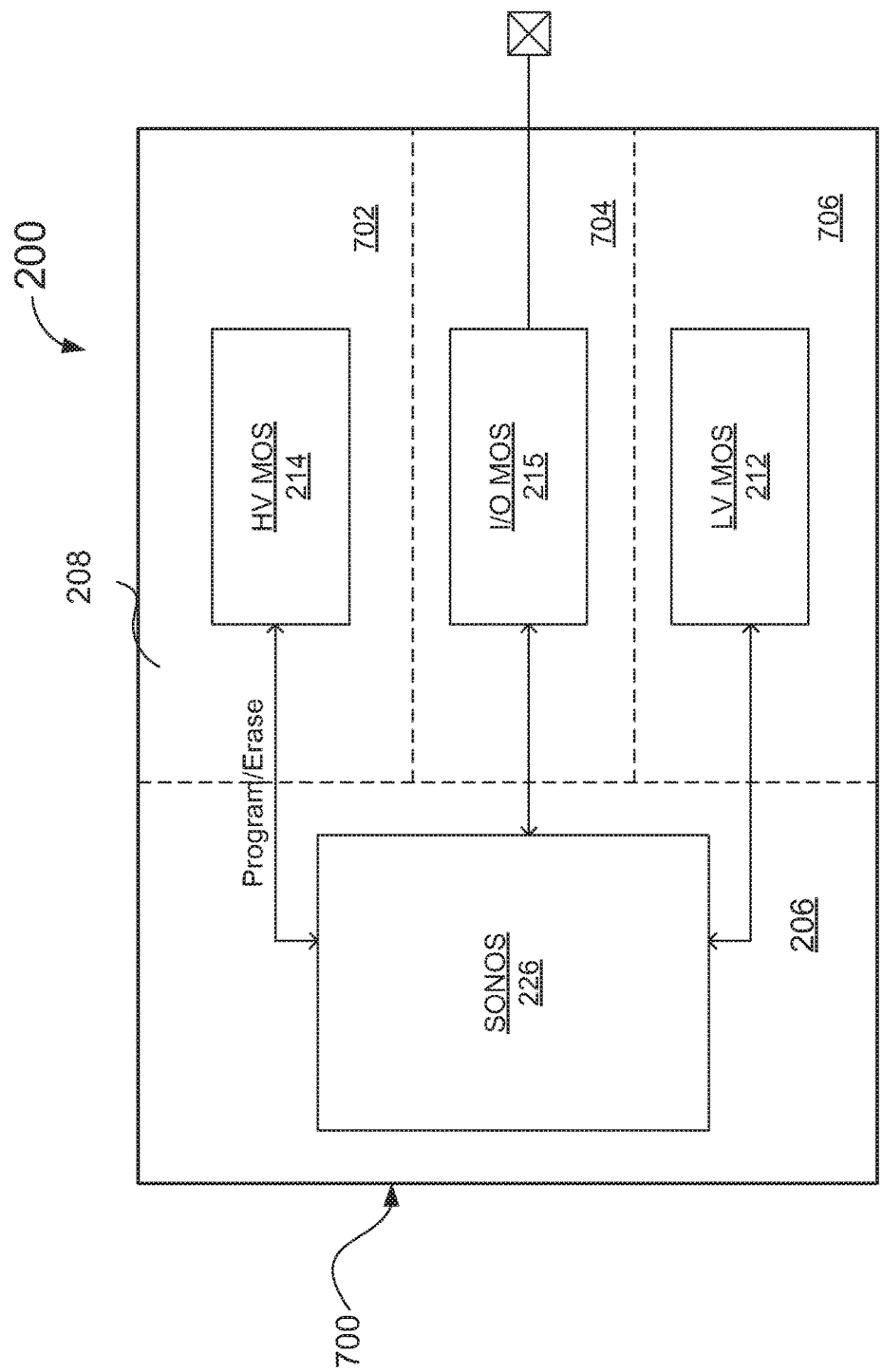
FIG. 7 is a representative block diagram illustrating one embodiment of embedded SONOS based NVM device 200, as fabricated in FIGS. 2A-2N.

FIG. 7 is a representative block diagram illustrating embedded SONOS based NVM device 200, as fabricated in FIGS. 2A-2N. In one embodiment, embedded SONOS based NVM device 200 is formed in a single semiconductor die or substrate 700. The semiconductor die or substrate 700 is at least divided into the first region 206 for NVM transistors 226 and the second region 208 for MOS transistors 212, 214, 216. The second region 208 may be further divided into HV MOS area 702, I/O MOS area 704, and LV MOS area 706. It will be the understanding that embedded SONOS based NVM device 200 may include other devices, such as processors, power circuits, etc. In various embodiments, the first and second regions may be overlapping, and the HV MOS area 702, I/O MOS area 704, and LV MOS area 706 may be overlapping. In will be the understanding that embodiment illustrated in FIG. 7 is only exemplary, and the first region 206 and the HV MOS area 702, I/O MOS area 704, and LV MOS area 706 may be located in any area of single substrate 700, and may be made up of various different regions.

In one embodiment, HV MOS 214 may be provided with a high voltage in a range of 4.5-12 V in order to program and/or erase NVM transistors in the first region. I/O MOS may be coupled to I/O interface and provided with an operation voltage in a range of 1.6 V-3.6 V. LV MOS 212 may be provided with an operation voltage in a range of 0.8 V-1.4 V for various operations and connections.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
    forming a dielectric stack, including tunneling dielectric, a charge-trapping layer, a cap layer and a sacrificial oxide layer, overlying first and second regions of a substrate;
    patterning the dielectric stack to form a non-volatile (NV) gate stack of a non-volatile memory (NVM) transistor in the first region while concurrently removing the dielectric stack in the second region;
    performing a first oxidation process to form a first gate oxide layer overlying the second region;
    removing the first gate oxide layer from second and third areas of the second region, but leaving the first gate oxide layer in a first area of the second region;
    performing a second oxidation process to form a second gate oxide layer in the second region, to concurrently consume at least a portion of the cap layer to form a blocking oxide of the NVM transistor in the first region, and to increase a thickness of the first gate oxide layer in the first area;
    removing the second gate oxide layer in the third area of the second region; and
    performing a third oxidation process to form a third gate oxide layer in the second region, and to concurrently increase thicknesses of the second gate oxide layer in the second area, the blocking oxide of the NVM transistor, and the thickness of the first gate oxide layer in the first area.

2. The method of claim 1, wherein performing the first oxidation process includes performing at least a dry furnace oxidation process, a rapid thermal oxidation (RTO) process, a rapid molecular oxidation, a chemical vapor deposition process, or a combination thereof.

3. The method of claim 1, wherein the second oxidation process includes a radical oxidation process.

4. The method of claim 1, wherein the third oxidation process includes a radical oxidation process.

5. The method of claim 4, wherein performing the third oxidation process includes providing a nitridizing atmosphere to the substrate to form a nitrogen rich silicon oxide film in at least the third gate oxide layer.

6. The method of claim 1, wherein forming the dielectric stack further includes:
    forming a lower charge-trapping layer overlying the tunnel dielectric;
    forming an anti-tunneling oxide layer overlying the lower charge-trapping layer; and
    forming an upper charge-trapping layer overlying the anti-tunneling oxide layer.

7. The method of claim 1, prior to performing the first oxidation process, further comprising:
    performing a gate oxide pre-clean process to remove the sacrificial oxide layer and at least a top portion of the cap layer in the NV gate stack in the first region and pad oxide in the second region.

8. The method of claim 1, wherein the first and second regions of the substrate are disposed within a single semiconductor die.

9. The method of claim 1, further comprising:
    patterning the first gate oxide layer to form a high voltage (HV) gate oxide of a HV metal-oxide-silicon (MOS) transistor in the first area of the second region;

patterning the second gate oxide layer to form an input/output (I/O) gate oxide of an I/O MOS transistor in the second area of the second region; and patterning the third gate oxide layer to form a low voltage (LV) gate oxide of a LV MOS transistor in the third area of the second region.

10. The method of claim 9, further comprising:

performing at least one wet cleaning process to control, a thickness of the HV gate oxide within an approximate range of 120 Å to 150 Å, a thickness of the I/O gate oxide within an approximate range of 50 Å to 55 Å, and a thickness of the LV gate oxide within an approximate range of 15 Å to 20 Å.

* * * * *